(12) United States Patent
Muthigi et al.

(10) Patent No.: US 12,720,711 B2
(45) Date of Patent: Aug. 25, 2026

(54) METHODS AND APPARATUS TO COOL HARDWARE

(71) Applicant: Intel Corporation, Santa Clara, CA (US)

(72) Inventors: Shreekanth Murthy Muthigi, Bangalore (IN); Casey Winkel, Hillsboro, OR (US); Chetan Maheshwari, Jamshedpur (IN)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 17/957,457

(22) Filed: Sep. 30, 2022

(65) Prior Publication Data

US 2023/0225084 A1 Jul. 13, 2023

(51) Int. Cl.
*H05K 7/20* (2006.01)
*G06F 1/20* (2006.01)
*H05K 1/02* (2006.01)

(52) U.S. Cl.
CPC ............. *H05K 7/2039* (2013.01); *G06F 1/20* (2013.01); *H05K 1/0201* (2013.01)

(58) Field of Classification Search
None
See application file for complete search history.

(56) References Cited

U.S. PATENT DOCUMENTS 5,014,117 A * 5/1991 Horvath .............. H10W 40/774 257/722
6,864,571 B2 * 3/2005 Arik .................. H10H 20/8586 257/E23.098
7,168,484 B2 * 1/2007 Zhang ..................... H01L 24/31 257/E23.09
8,735,274 B2 * 5/2014 Mizukoshi .............. H01L 24/16 257/E21.509
8,749,979 B2 * 6/2014 Iwai ...................... H01L 23/373 361/708
8,958,207 B2 * 2/2015 Yamaguchi ........... H01L 23/373 361/708
11,387,202 B2 * 7/2022 Haba ................. H01L 23/49811
2006/0131679 A1 * 6/2006 Hantschel ............ H10D 62/118 257/415

(Continued)

FOREIGN PATENT DOCUMENTS

GB 2576032 B 4/2021
GB 2576030 B 12/2021

(Continued)

OTHER PUBLICATIONS

German Patent Office, "Office Action," issued in connection with German Patent Appl. No. 102023207039.1, dated Aug. 21, 2023, 9 pages. [English machine translation included].

*Primary Examiner* — Courtney L Smith

(74) *Attorney, Agent, or Firm* — Hanley, Flight & Zimmerman, LLC

(57) ABSTRACT

Methods and apparatus are disclosed to cool hardware. An example apparatus to cool a hardware component includes a first substrate; a second substrate couplable to a chassis, the second substrate formed of a metal; and a plurality of malleable fins coupled between the first and second substrates, the malleable fins formed of a thermally conductive material.

15 Claims, 27 Drawing Sheets

(56) References Cited

U.S. PATENT DOCUMENTS

| | | | | |
|---|---|---|---|---|
| 2012/0236502 | A1* | 9/2012 | Yamaguchi | H10W 40/77 427/124 |
| 2013/0258600 | A1* | 10/2013 | Deng | H05K 7/2039 156/60 |
| 2013/0307136 | A1* | 11/2013 | Yamaguchi | H01L 23/433 977/932 |
| 2014/0151009 | A1* | 6/2014 | Bahadur | F28F 13/00 165/185 |
| 2016/0086872 | A1* | 3/2016 | Sakita | H01L 23/42 165/185 |
| 2021/0320050 | A1 | 10/2021 | Robinson et al. | |
| 2022/0042750 | A1* | 2/2022 | Eid | F28F 13/003 |
| 2022/0102307 | A1* | 3/2022 | Summerfelt | H05K 3/325 |
| 2024/0098952 | A1* | 3/2024 | Yow | H01L 23/473 |

FOREIGN PATENT DOCUMENTS

| | | | |
|---|---|---|---|
| GB | 2601357 | A | 1/2022 |
| GB | 2597525 | A | 2/2022 |

* cited by examiner 702
750
850
820
820
820
820
820
1120
1120
1120
1120
1150
1150
1150
1150
934
930
1100

METHODS AND APPARATUS TO COOL HARDWARE

FIELD OF THE DISCLOSURE

This disclosure relates generally to heat dissipating devices and, more particularly, to methods and apparatus to cool hardware.

BACKGROUND

A heatsink is a heat dissipating device that transfers heat from a hardware component to a surrounding coolant or ambient environment. The surrounding coolant could be, but is not limited to, water, air, and/or oil. A conventional heatsink includes a base and a series of protrusions extending therefrom, which increase a surface area that is in contact with the surrounding coolant. In operation, heat is transferred from the hardware component to the heatsink (via conduction), from the heatsink to the ambient (via convection), and from the ambient to another location (via convection).

Figure 1:
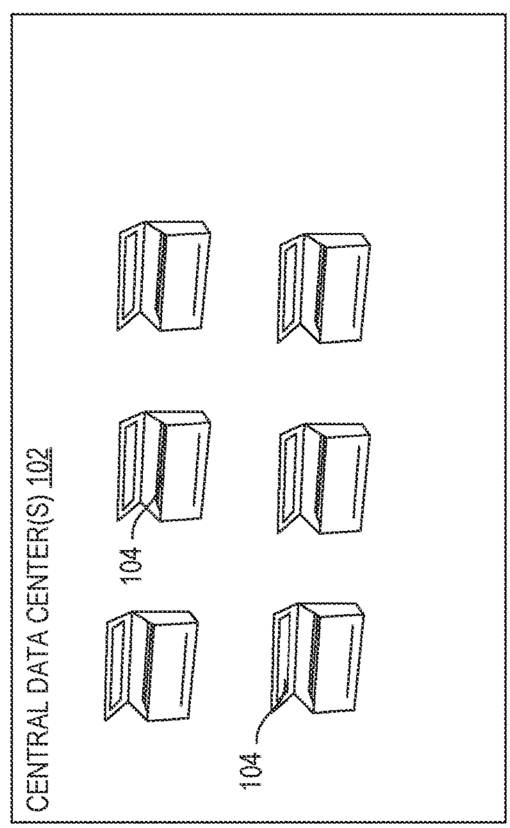
FIG. 1 illustrates one or more example environments in which teachings of this disclosure may be implemented.
Figure 1:
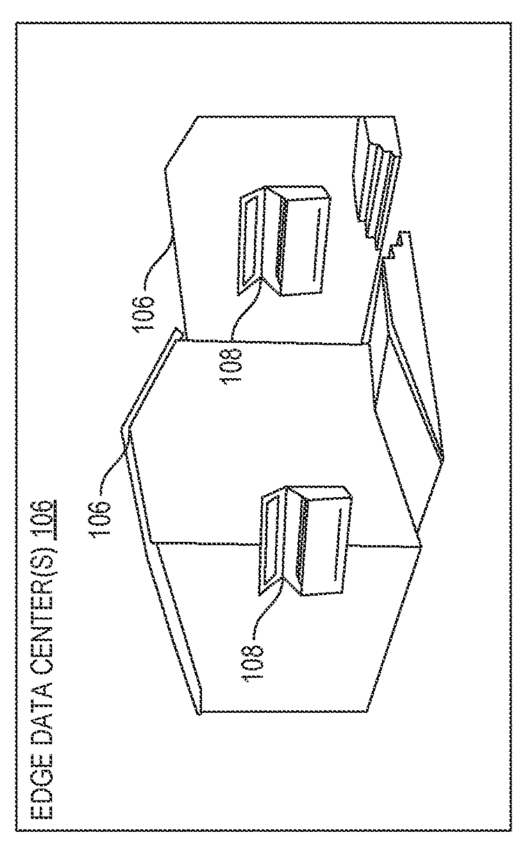
Figure 1:
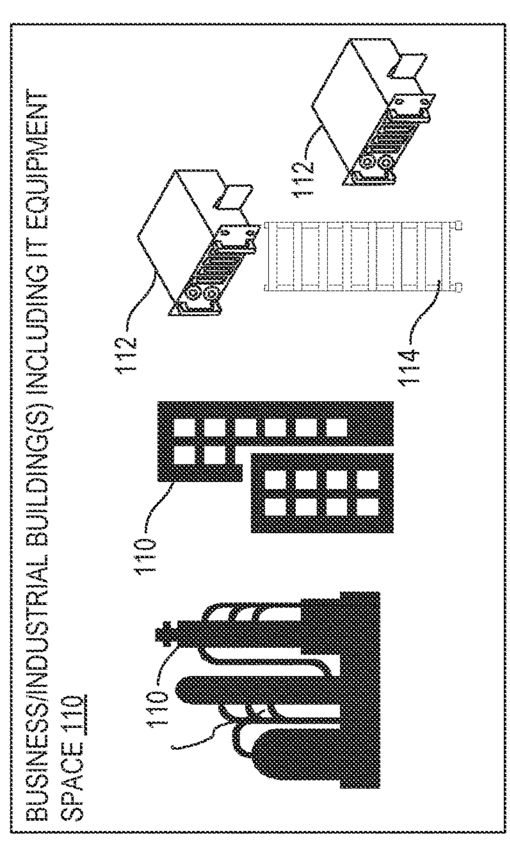
Figure 1:
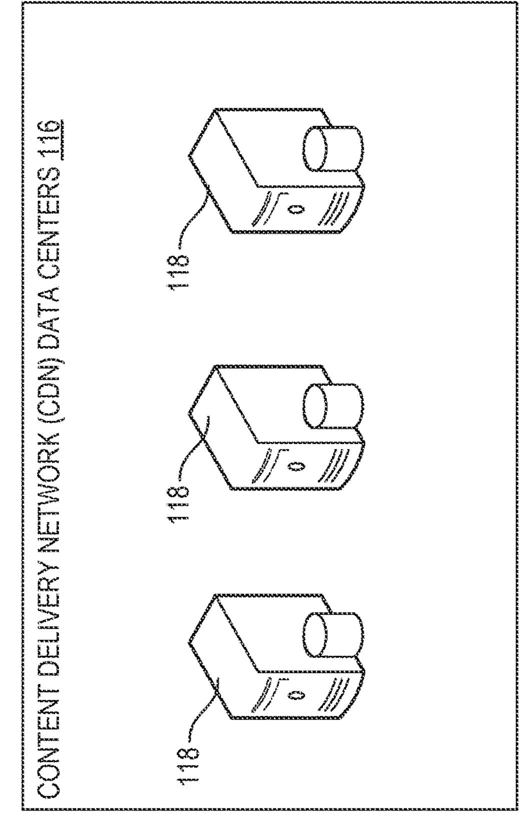

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

As disclosed herein, a processor (e.g., processor package, an integrated circuit package, etc.) may include one or more example dies that are coupled to an example substrate and encapsulated by an integrated heat spreader for protection. The processor may include interconnects between the die(s) and leads, pins, or bumps located on external portions of the substrate.

DETAILED DESCRIPTION

Certain hardware components of an electronic device, such as (but not limited to) a processor, generate heat during operation. While the electronic device and the components thereof are designed to tolerate some amount of heat, operating such thermally hot components above recommended conditions could compromise the component(s) in terms of reliability, lifetime, and/or performance. In some examples, operating such a component above its recommended temperature can result in failure of the components, sometimes to the extent of a safety hazard. Components that are susceptible to temporary malfunction and/or permanent failure if overheated include (but are not limited to) integrated circuits such as central processing units (CPUs), graphics processing units (GPUs), chipsets, graphics cards, and hard disk drives.

Component cooling is needed to remove heat produced by the electronic device to keep the components within permissible operating temperature limits. An example technique for component cooling is to thermally couple a heatsink to the heat generating component(s). Example heatsinks include a base and a plurality of fins extending from the base. Traditional (e.g., conventional) heatsinks include fins that are rigid (e.g., inflexible, stiff, etc.), such as plate-type fins, pin fins, spayed fins, etc. To improve heat transfer from the heatsinks fins to the ambient, the heatsink fins are often placed in and/or aligned with a direction of air flow.

Heatsink design and performance may be based on one or more factors and/or considerations, such as for example a size of a component over which the heatsink is spaced, air velocity in the ambient environment, choice of heatsink material(s), fin design, and/or surface treatment. For example, an amount of heat dissipated by a component over which the heatsink is placed and an availability of air flow in the ambient region surrounding the heatsink may be determinative of a surface area and/or cross section needed for the heatsink to cool the component. The surface area needed for the heatsink can be used in combination with mechanical mounting considerations to determine a size and/or quantity of the rigid fins. The mechanical mounting considerations refers to restrictions based on an amount of space available to mount the heatsink. For example, a size of the component over which the heatsink is positioned may be determinative of a size of the heatsink base. Thus, a smaller sized component may limit the size of heatsink base and, correspondingly, a number of heatsink fins that can extend from the base. In some examples, a chassis height may set a constraint on a height of internal components and, correspondingly, a height of the heatsink fins. Alignment of the heatsink fins in the direction of airflow may depend on a location of the component on a printed circuit board (PCB) and an availability of abundant air-flow in the region. Often, such factors pose restrictions and challenges with designing rigid finned heatsinks and implementing such rigid finned heatsinks in electronic devices.

Technological improvements have been driving reductions in package sizes of hardware components and/or active devices mounted on a printed circuit board (PCB). Further, growing trends to densely place the hardware components on the PCB have translated into high power densities that need to be adequately cooled to prevent overheating. As package sizes decrease and amount of power dissipated increases, increasingly smaller heatsinks will be used to remove larger amounts heat. In some examples, the rigid fins may be reduced in size to a point where they may not suffice because of the mechanical challenge in manufacturing and/or the higher cost necessitated by advanced engineering techniques. In some examples, an amount of heat that is to be dissipated from the component combined with an inability to increase a surface area of the rigid finned heatsink (e.g., due to packaging size constraints) may result in an inability of rigid finned heatsinks to sufficiently cool the electronic device.

Example methods, systems, articles of manufacture, and apparatus to cool hardware using flexible fins are disclosed herein. Example flexible fins disclosed herein may be utilized where conventional rigid heatsinks cannot be implemented and/or do not provide enough cooling based on mechanical mounting restrictions. In some examples, the example heatsinks with flexible fins may be used in addition to rigid heatsinks.

Examples flexible heatsinks (e.g., flexible finned heatsink) disclosed herein include flexible (e.g., malleable) fins coupled to a heatsink base. The flexible fins may include, for example, thermally conductive wires, metal strips, grooved hollow tubes, helical spring wires, combinations thereamong, etc. Some example flexible heatsinks disclosed herein include wire fins, which may be thinner than conventional rigid fins. The wire fins can increase a surface area of the flexible heatsink that is exposed to the air flow to reduce a thermal resistance of the heatsink and allow increased heat transfer. In some examples, a number of wires extending from a base can be increased to expand a surface area exposure for heat dissipation. Certain example flexible heatsinks disclosed herein can improve heat dissipation with little to no increase in a PCB footprint. Some examples disclosed herein include flexible fins in addition to rigid fins to further enhance the heatsinks performance.

In some examples, example flexible fins disclosed herein may be coupled to and/or between thermally conductive plates. In some examples, the base is a thermally conductive plate that is placed over or otherwise adjacent a heat generating component. In some examples, another thermally conductive plate (e.g., a termination plate, an attachment plate, etc.) may be attached to a cool and accessible location on a chassis side wall, top cover, bottom cover, rear panel, and/or front panel. In some examples, example flexible fins disclosed herein provide conductive heat transfer between the thermally conductive plates by transferring heat to relatively cooler areas and convective heat transfer via the airflow through the flexible fins. In some examples, example flexible fins may be soldered and/or brazed to at least one of the thermally conductive plates. In some examples, the flexible fins may be inserted into slots (e.g., holes) that are formed in at least one of the thermally conductive plates (e.g., by tapping, drilling, molding, etc.).

Example flexible heatsinks disclosed herein enable flexibility in heatsink design. For example, using wires as fins provides increased flexibility for chassis constraints because the flexible fins can be increased in length to allow metal plate attachment to a chassis. Further, in some examples, example flexible fins disclosed herein can be increased in length to increase surface area exposure to an ambient regardless of a chassis height surrounding the flexible fins. In some examples, example flexible heatsink disclosed herein enable the flexibility to spread the flexible fins with little to no impact on heat transfer through the flexible fin itself.

Example flexible heatsinks disclosed herein can be used for quick-to-build engineering prototypes and/or development itself. Examples disclosed herein enable lower cost heatsinks by including flexible fins as opposed to increasing a number of rigid fins. For example, rigid heatsinks may require advanced manufacturing technology to enhance the performance of the rigid heatsink, increasing an over-all cost of the rigid heatsink. Integrating example flexible fins disclosed herein can reduce a cost associated with manufacturing the flexible heatsink. Examples disclosed herein also are compliant with industry regulations and consumer demands by enabling use of fans that are lower power, lower cost, and/or quieter. Thus, examples disclosed herein enable manufacture of less noisy computing systems.

While examples disclosed herein are discussed in terms of cooling an active heat generating hardware component, example flexible heatsinks disclosed herein can be applied to additional or alternative applications. For example, disclosed flexible heatsinks can be used for back side cooling of thermally hot components on the secondary side of the PCB by routing example flexible fins to the secondary side of the PCB and terminating with thermally conductive plate to remove heat. In some examples, example flexible fins disclosed herein can be applied on add-in cards and/or chips, such a network interface card(s) (NIC), a SmartNIC(s), an accelerator(s), etc.

FIG. 1 illustrates one or more example environments in which teachings of this disclosure may be implemented. The example environment(s) of FIG. 1 can include one or more central data centers 102. The central data center(s) 102 can store a large number of servers used by, for instance, one or more organizations for data processing, storage, etc. As illustrated in FIG. 1, the central data center(s) 102 include a plurality of immersion tank(s) 104 to facilitate cooling of the servers and/or other electronic components stored at the central data center(s) 102. The immersion tank(s) 104 can provide for single-phase immersion cooling or two-phase immersion cooling.

As noted above, the use of liquids to cool electronic components is being explored for its benefits over more traditional air cooling systems, as there are increasing needs to address thermal management risks resulting from increased thermal design power in high performance systems (e.g., CPU and/or GPU servers in data centers, cloud computing, edge computing, and the like). More particularly, relative to air, liquid has inherent advantages of higher specific heat (when no boiling is involved) and higher latent heat of vaporization (when boiling is involved). In some instances, liquid can be used to indirectly cool electronic components by cooling a cold plate that is thermally coupled to the electronic components. An alternative approach is to directly immerse electronic components in the cooling liquid. In direct immersion cooling, the liquid can be in direct contact with the electronic components to directly draw away heat from the electronic components. To enable the cooling liquid to be in direct contact with electronic components, the cooling liquid is electrically insulative (e.g., a dielectric liquid).

Direct immersion cooling can involve at least one of single-phase immersion cooling or two-phase immersion cooling. As used herein, single-phase immersion cooling means the cooling fluid (sometimes also referred to herein as cooling liquid or coolant) used to cool electronic components draws heat away from heat sources (e.g., electronic components) without changing phase (e.g., without boiling and becoming vapor). Such cooling fluids are referred to herein as single-phase cooling fluids, liquids, or coolants. By contrast, as used herein, two-phase immersion cooling means the cooling fluid (in this case, a cooling liquid) vaporizes or boils from the heat generated by the electronic components to be cooled, thereby changing from the liquid phase to the vapor phase. The gaseous vapor may subsequently be condensed back into a liquid (e.g., via a condenser) to again be used in the cooling process. Such cooling fluids are referred to herein as two-phase cooling fluids, liquids, or coolants. Notably, gases (e.g., air) can also be used to cool components and, therefore, may also be referred to as a cooling fluid and/or a coolant. However, immersion cooling typically involves at least one cooling liquid (which may or may not change to the vapor phase when in use). Example systems, apparatus, and associated methods to improve immersion cooling systems and/or associated cooling processes are disclosed herein.

The example environments of FIG. 1 can be part of an edge computing system. For instance, the example environments of FIG. 1 can include edge data centers or micro-data centers 106. The edge data center(s) 106 can include, for example, data centers located at a base of a cell tower. In some examples, the edge data center(s) 106 are located at or near a top of a cell tower and/or other utility pole. The edge data center(s) 106 include respective housings that store server(s), where the server(s) can be in communication with, for instance, the server(s) stored at the central data center(s) 102, client devices, and/or other computing devices in the edge network. Example housings of the edge data center(s) 106 may include materials that form one or more exterior surfaces that partially or fully protect contents therein, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. As illustrated in FIG. 1, the edge data center(s) 106 can include immersion tank(s) 108 to store server(s) and/or other electronic component(s) located at the edge data center(s) 106.

The example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other computing device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed in immersion cooling tank(s) such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building(s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure.

Figure 2:
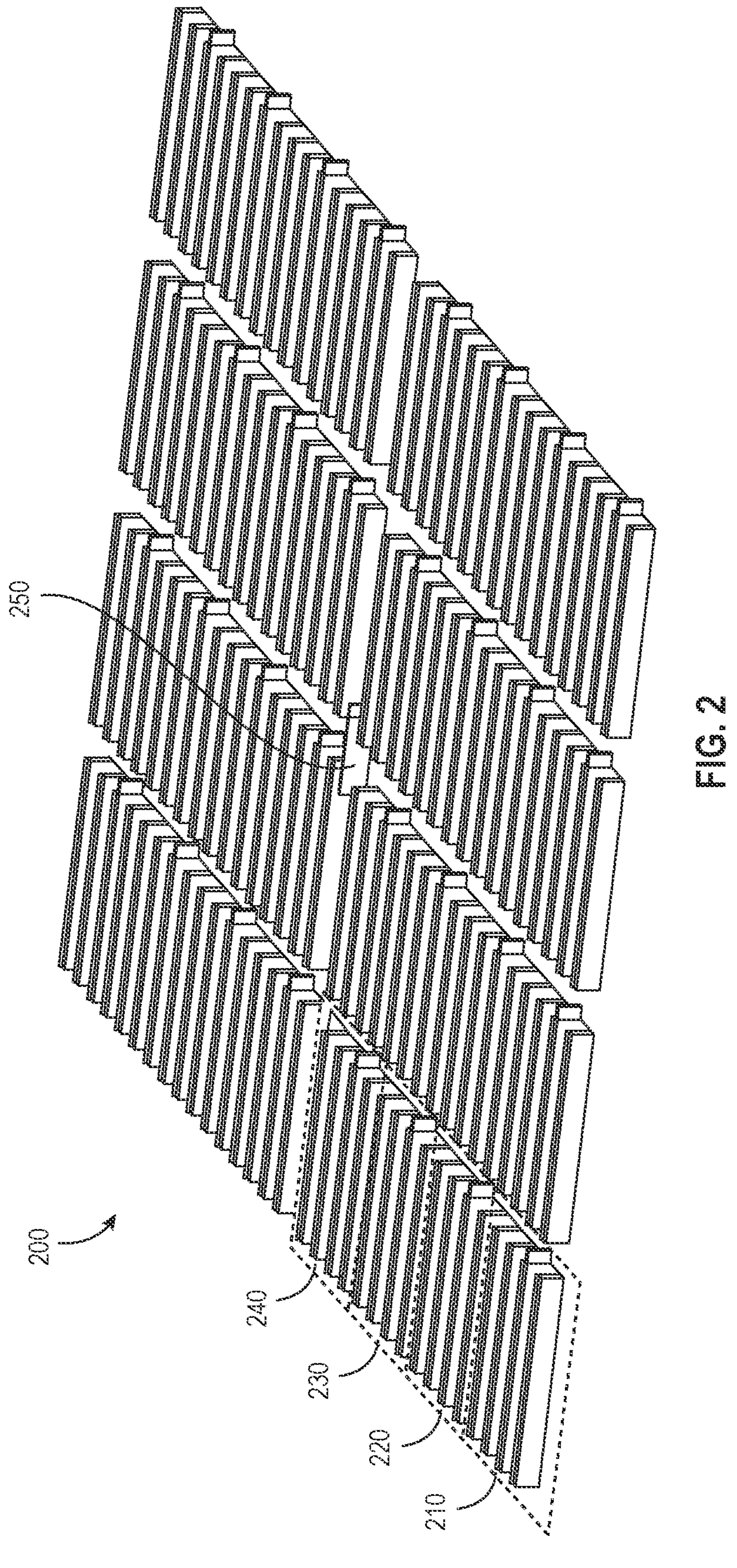
FIG. 2 illustrates at least one example of a data center for executing workloads with disaggregated resources.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose processors), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200. In some examples, the sleds may be connected with a fabric using Intel Omni-Path™ technology. In other examples, the sleds may be connected with other fabrics, such as InfiniBand or Ethernet. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first processor circuitry assigned to one managed node and second processor circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include predominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage and perhaps additional resources in a single chassis. For example, because a given sled will contain mostly resources of a same particular type, resources of that type can be upgraded independently of other resources. Additionally, because different resource types (processors, storage, accelerators, etc.) typically have different refresh rates, greater resource utilization and reduced total cost of ownership may be achieved. For example, a data center operator can upgrade the processor circuitry throughout a facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
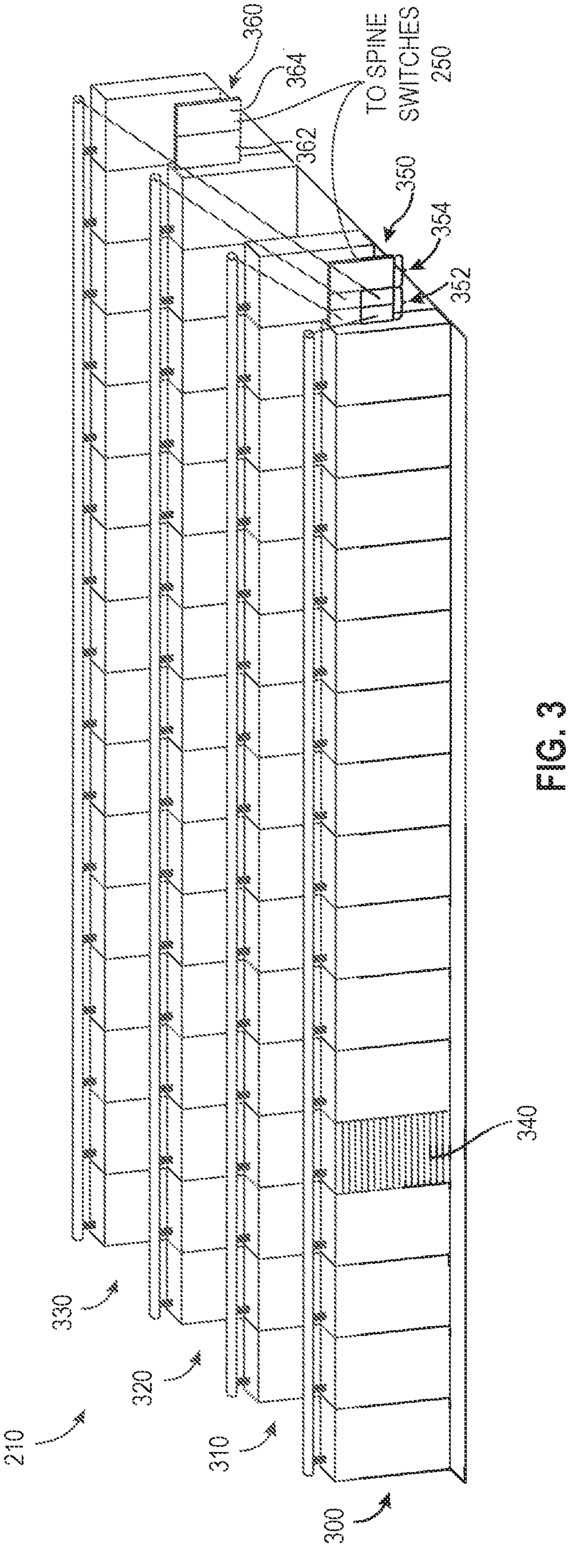
FIG. 3 illustrates at least one example of a pod that may be included in the data center of FIG. 2.

Referring now to FIG. 3, the pod 210, in the illustrative example, includes a set of rows 300, 310, 320, 330 of racks 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dual-mode optical switches, capable of routing both Ethernet protocol communications carrying Internet Protocol (IP) packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
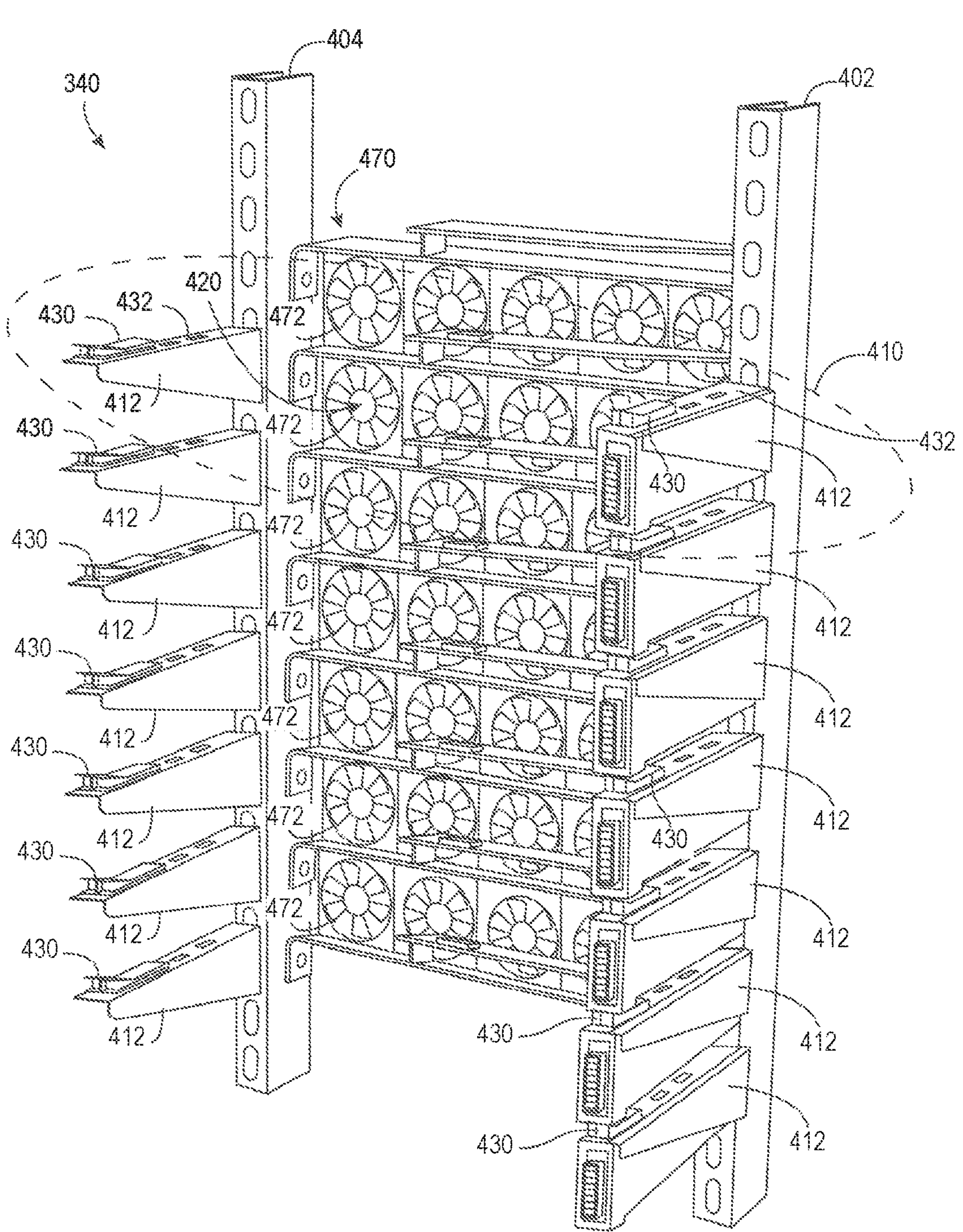
FIG. 4 is a perspective view of at least one example of a rack that may be included in the pod of FIG. 3.
Figure 5:
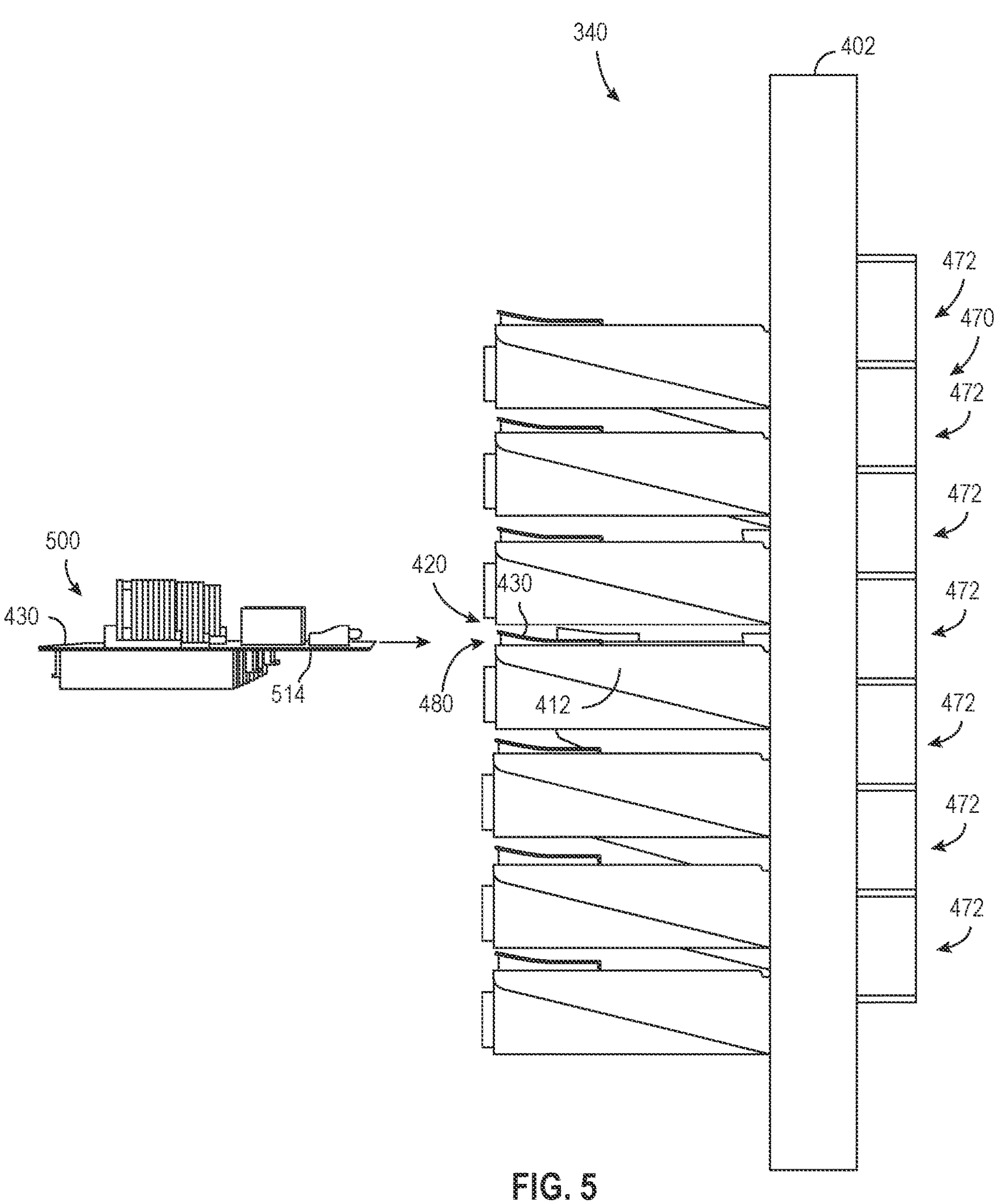
FIG. 5 is a side elevation view of the rack of FIG. 4.
Figure 6:
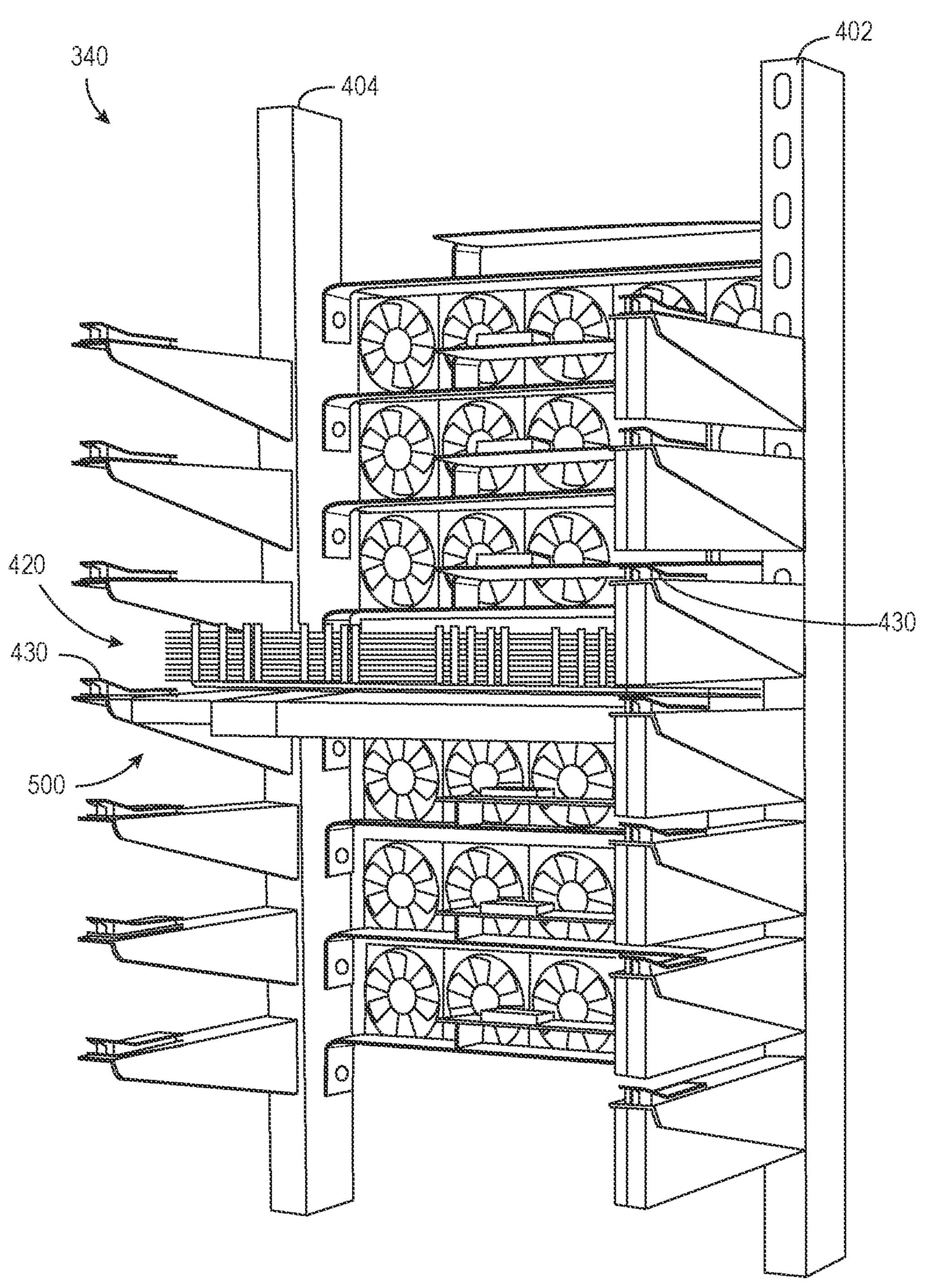
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., processors, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG. 5. By having robotically accessible and robotically manipulable sleds including disaggregated resources, the different types of resource can be upgraded independently of one other and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "IU"). That is, the vertical distance between pairs 410 of elongated support arms 412 may be less than a standard rack unit "IU." Additionally, due to the relative decrease in height of the sled slots 420, the overall height of the rack 340 in some examples may be shorter than the height of traditional rack enclosures. For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1U". In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
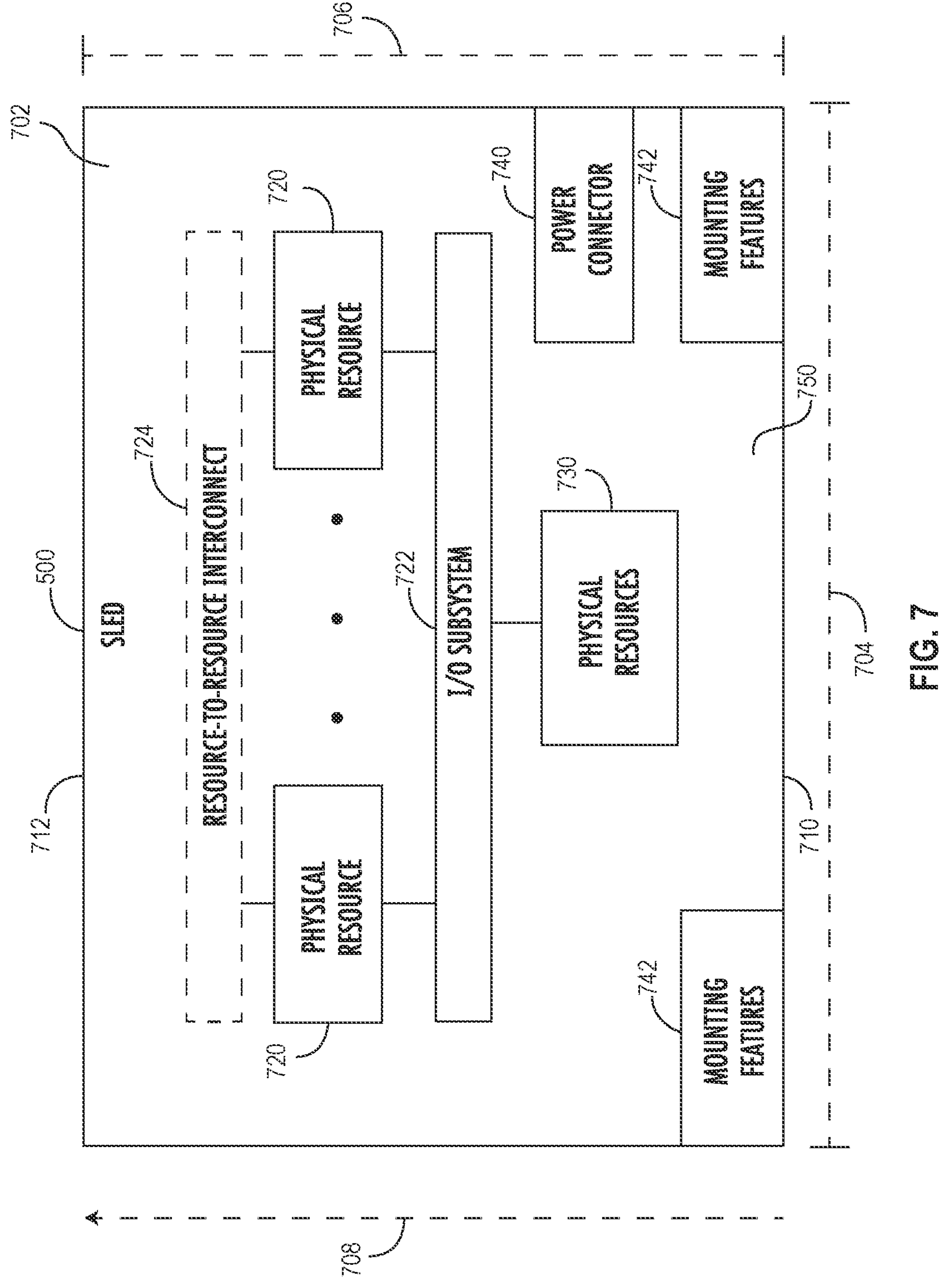
FIG. 7 is a is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a give sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches. As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase immersion cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of processor, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processors in examples in which the sled 500 is implemented as a compute sled, as accelerator co-processors or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The I/O subsystem 722 may be implemented as circuitry and/or components to facilitate input/output operations with the physical resources 720, the physical resources 730, and/or other components of the sled 500. For example, the I/O subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus or a DDR5 data bus.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500. That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850 (see FIG. 8) of the chassis-less circuit board substrate 702 directly opposite of processor circuitry 920 (see FIG. 9), and power is routed from the voltage regulators to the processor circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 700 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
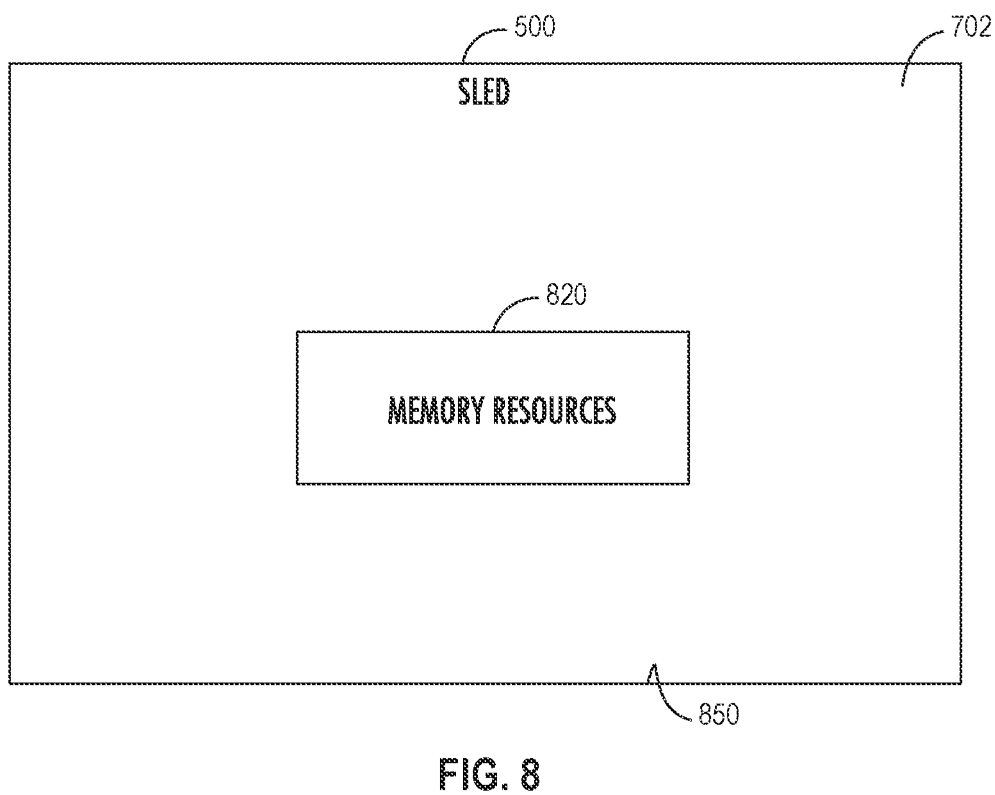
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
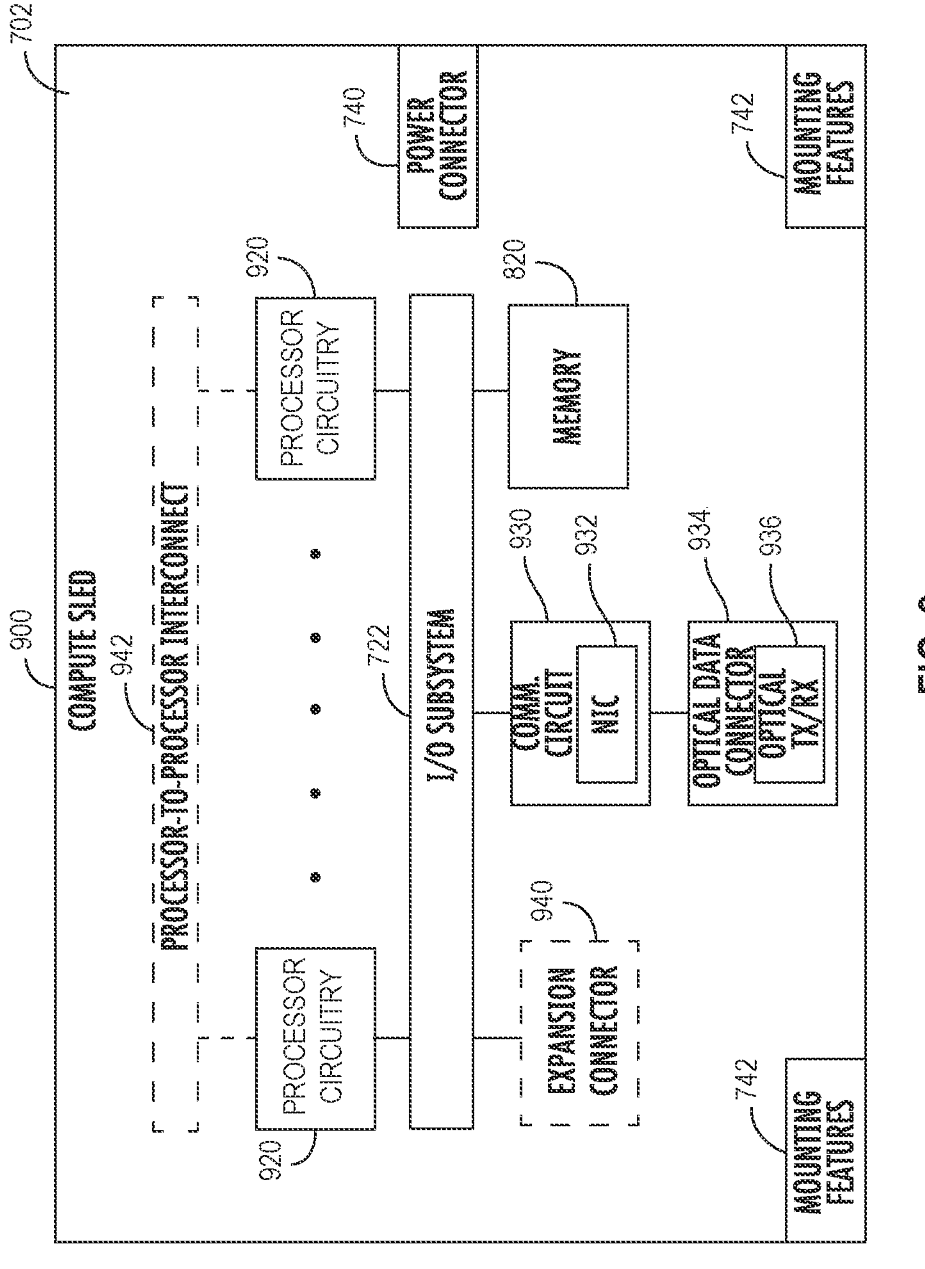
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include processor circuitry 920. Although only two blocks of processor circuitry 920 are shown in FIG. 9, it should be appreciated that the compute sled 900 may include additional processor circuits 920 in other examples. Illustratively, the processor circuitry 920 corresponds to high-performance processors 920 and may be configured to operate at a relatively high power rating. Although the high-performance processor circuitry 920 generates additional heat operating at power ratings greater than typical processors (which operate at around 155-230 W), the enhanced thermal cooling characteristics of the chassis-less circuit board substrate 702 discussed above facilitate the higher power operation. For example, in the illustrative example, the processor circuitry 920 is configured to operate at a power rating of at least 250 W. In some examples, the processor circuitry 920 may be configured to operate at a power rating of at least 350 W.

In some examples, the compute sled 900 may also include a processor-to-processor interconnect 942. Similar to the resource-to-resource interconnect 724 of the sled 500 discussed above, the processor-to-processor interconnect 942 may be implemented as any type of communication interconnect capable of facilitating processor-to-processor interconnect 942 communications. In the illustrative example, the processor-to-processor interconnect 942 is implemented as a high-speed point-to-point interconnect (e.g., faster than the I/O subsystem 722). For example, the processor-to-processor interconnect 942 may be implemented as a QuickPath Interconnect (QPI), an UltraPath Interconnect (UPI), or other high-speed point-to-point interconnect dedicated to processor-to-processor communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the NIC 932 may be implemented as part of a system-on-a-chip (SoC) that includes one or more processors, or included on a multichip package that also contains one or more processors. In some examples, the NIC 932 may include a local processor (not shown) and/or a local memory (not shown) that are both local to the NIC 932. In such examples, the local processor of the NIC 932 may be capable of performing one or more of the functions of the processor circuitry 920. Additionally or alternatively, in such examples, the local memory of the NIC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the processor circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 10:
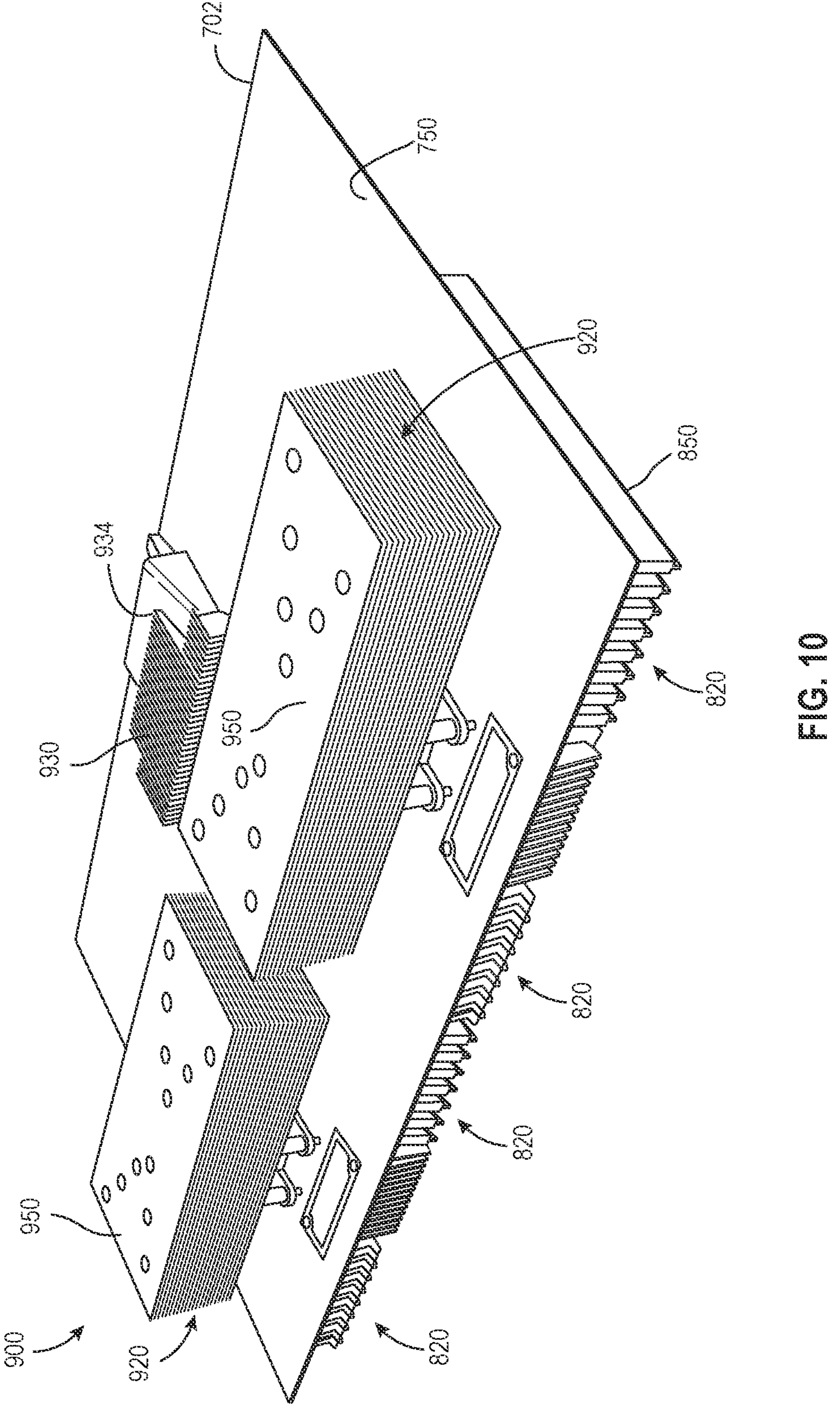
FIG. 10 is a top perspective view of at least one example of the compute sled of FIG. 9.

Referring now to FIG. 10, an illustrative example of the compute sled 900 is shown. As shown, the processor circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor socket), holders, or brackets. In some cases, some of the electrical components may be directly mounted to the chassis-less circuit board substrate 702 via soldering or similar techniques.

As discussed above, the separate processor circuitry 920 and the communication circuit 930 are mounted to the top side 750 of the chassis-less circuit board substrate 702 such that no two heat-producing, electrical components shadow each other. In the illustrative example, the processor circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the processor circuitry 920 located on the top side 750 via the I/O subsystem 722. Because the chassis-less circuit board substrate 702 is implemented as a double-sided circuit board, the memory devices 820 and the processor circuitry 920 may be communicatively coupled by one or more vias, connectors, or other mechanisms extending through the chassis-less circuit board substrate 702. Different processor circuitry 920 (e.g., different processors) may be communicatively coupled to a different set of one or more memory devices 820 in some examples. Alternatively, in other examples, different processor circuitry 920 (e.g., different processors) may be communicatively coupled to the same ones of the memory devices 820. In some examples, the memory devices 820 may be mounted to one or more memory mezzanines on the bottom side of the chassis-less circuit board substrate 702 and may interconnect with a corresponding processor circuitry 920 through a ball-grid array.

Different processor circuitry 920 (e.g., different processors) include and/or is associated with corresponding heatsinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional "free" area or space that facilitates the use of heatsinks 950 having a larger size relative to traditional heatsinks used in typical servers. Additionally, due to the improved thermal cooling characteristics of the chassis-less circuit board substrate 702, none of the processor heatsinks 950 include cooling fans attached thereto. That is, the heatsinks 950 may be fan-less heatsinks. In some examples, the heatsinks 950 mounted atop the processor circuitry 920 may overlap with the heatsink attached to the communication circuit 930 in the direction of the airflow path 708 due to their increased size, as illustratively suggested by FIG. 10.

Figure 11:
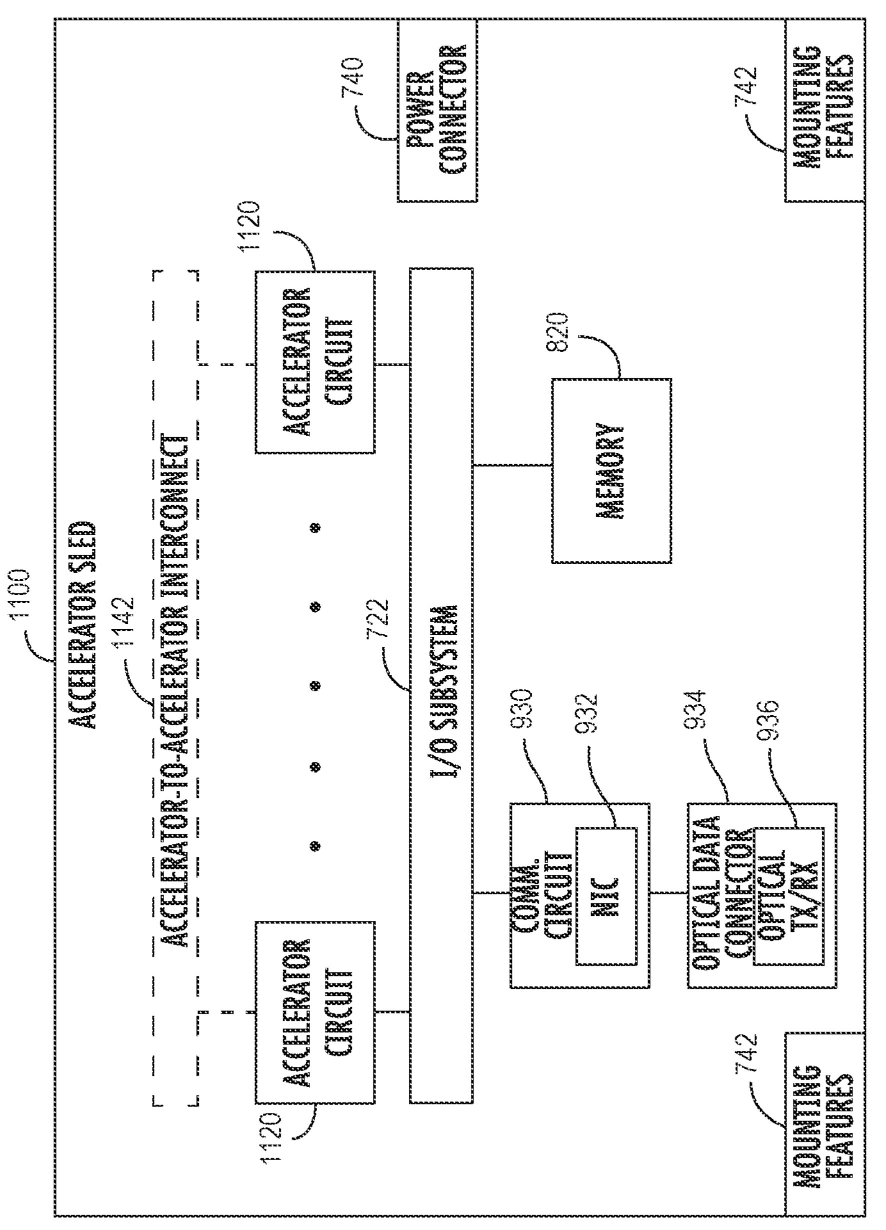
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
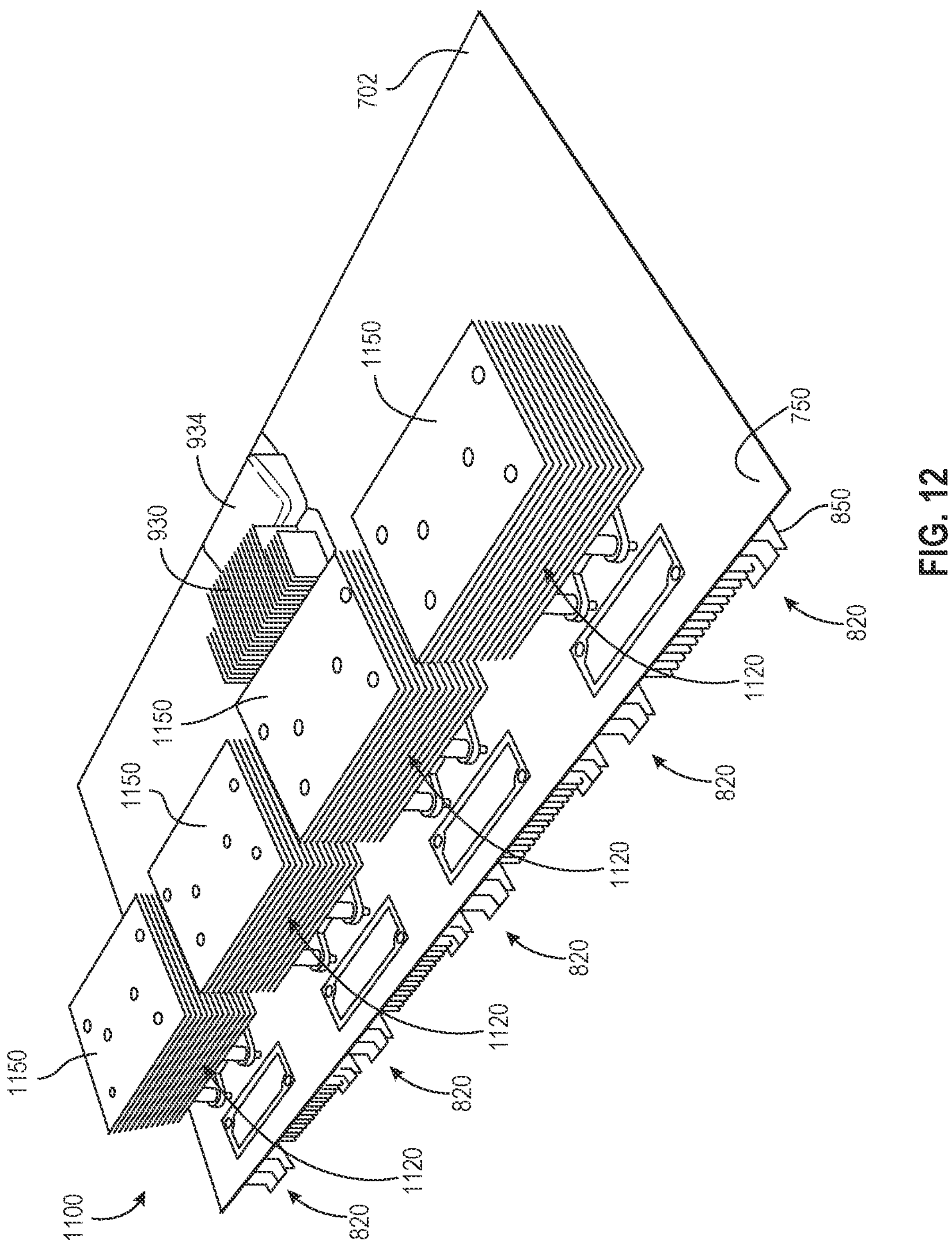
FIG. 12 is a top perspective view of at least one example of the accelerator sled of FIG. 10.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor, co-processor, compute circuit, or other device capable of performing compute or processing operations. For example, the accelerator circuits 1120 may be implemented as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some examples, the accelerator sled 1100 may also include an accelerator-to-accelerator interconnect 1142.

Similar to the resource-to-resource interconnect 724 of the sled 700 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to processor-to-processor communications. In some examples, the accelerator circuits 1120 may be daisy-chained with a primary accelerator circuit 1120 connected to the NIC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 700. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
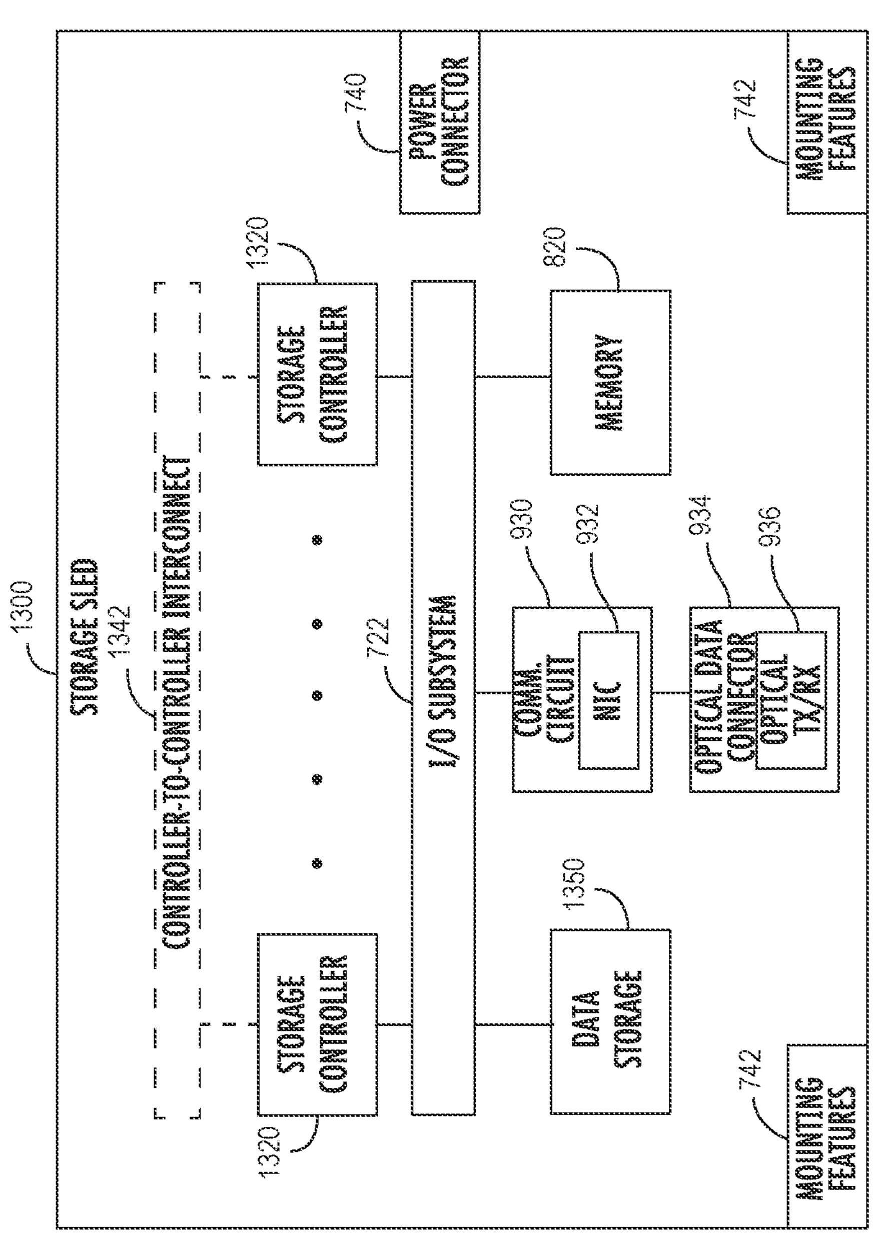
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of processor, controller, or control circuit capable of controlling the storage and retrieval of data into the data storage 1350 based on requests received via the communication circuit 930. In the illustrative example, the storage controllers 1320 are implemented as relatively low-power processors or controllers. For example, in some examples, the storage controllers 1320 may be configured to operate at a power rating of about 75 watts.

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to processor-to-processor communications.

Figure 14:
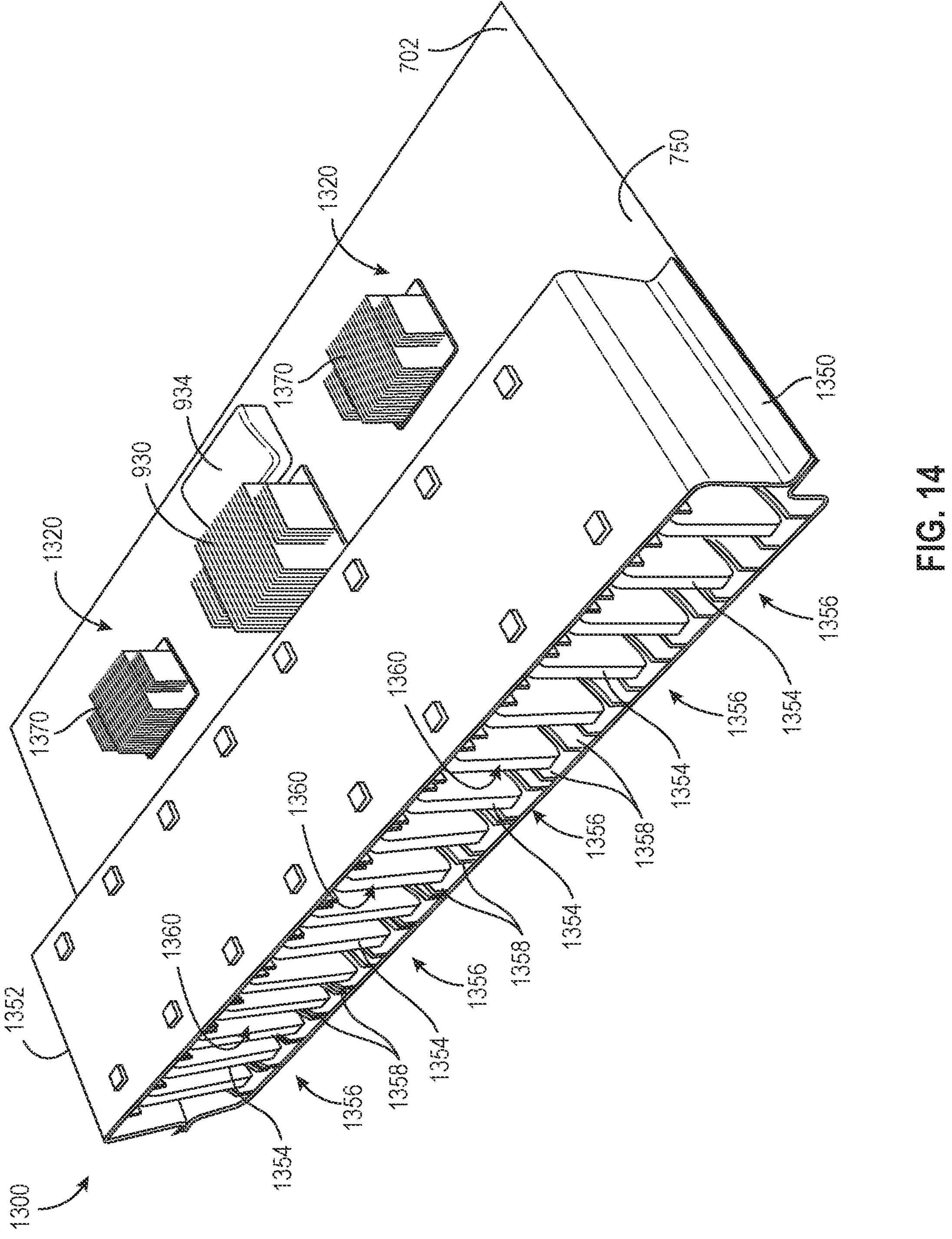
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening 1360 of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 304. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
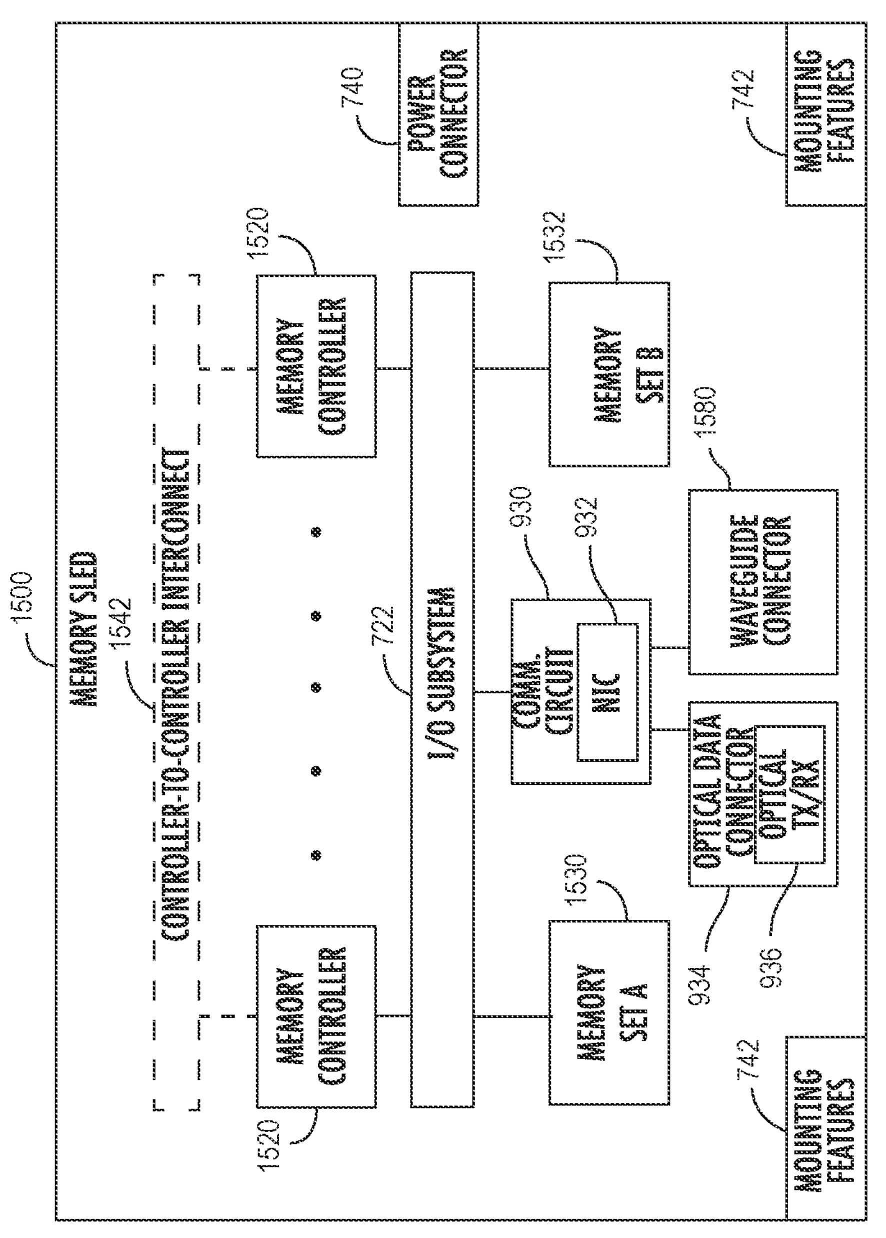
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1300. For example, during operation, a compute sled 900 or an accelerator sled 1100 may remotely write to and/or read from one or more of the memory sets 1530, 1532 of the memory sled 1300 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of processor, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to processor-to-processor communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit) lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
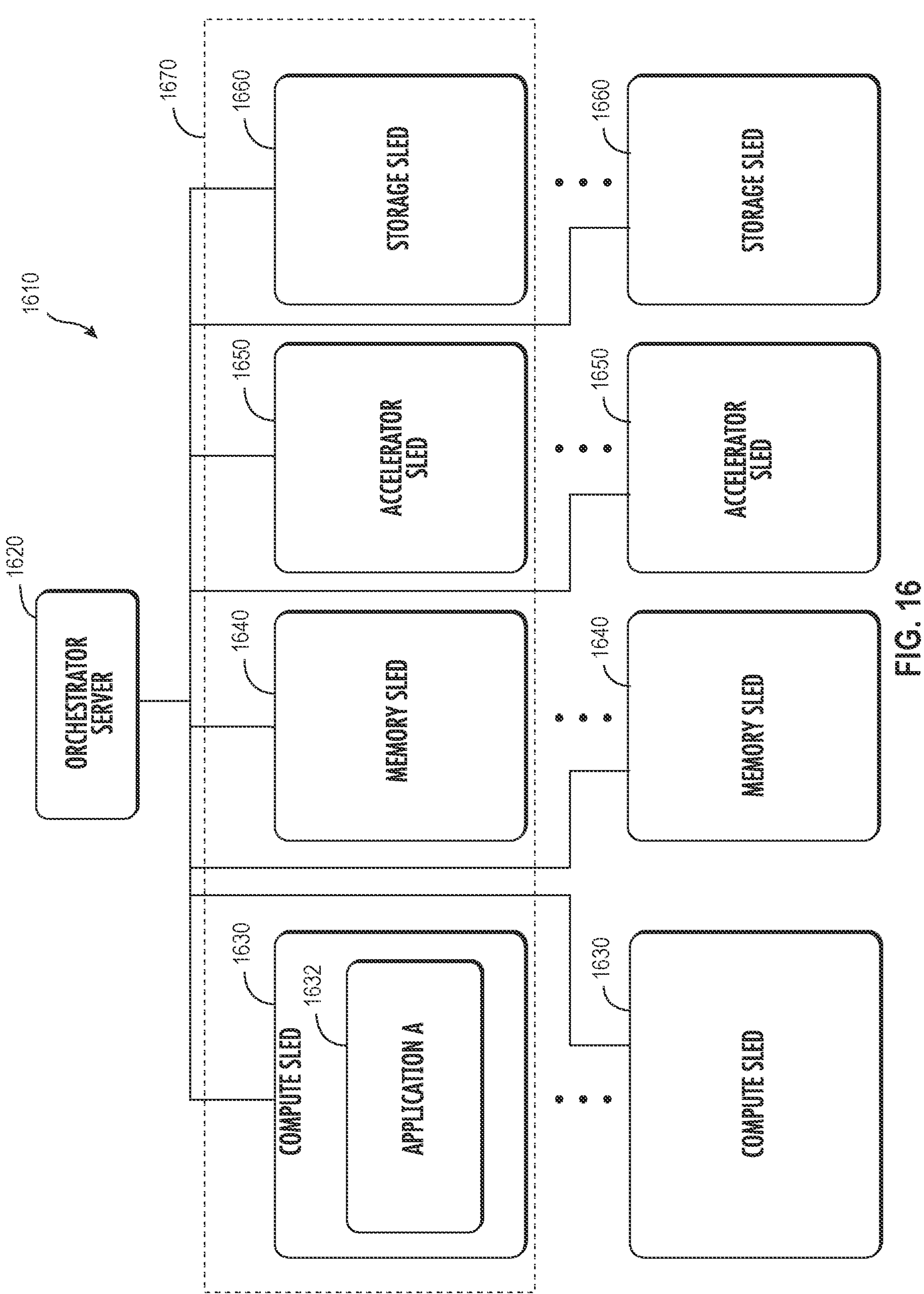
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., processor circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to the memory sled 1500), accelerator sleds 1650 (e.g., similar to the memory sled 1000), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as processor circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations characteristics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among compute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to managed nodes as a function of the map of heat generation and predicted heat generation associated with different workloads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1620 may determine the differences based on the telemetry data stored in the hierarchical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a predefined threshold, etc.). The given sled 500 may then report back a simplified result (e.g., yes or no) to the orchestrator server 1620, which the orchestrator server 1620 may utilize in determining the allocation of resources to managed nodes.

Figure 17A:
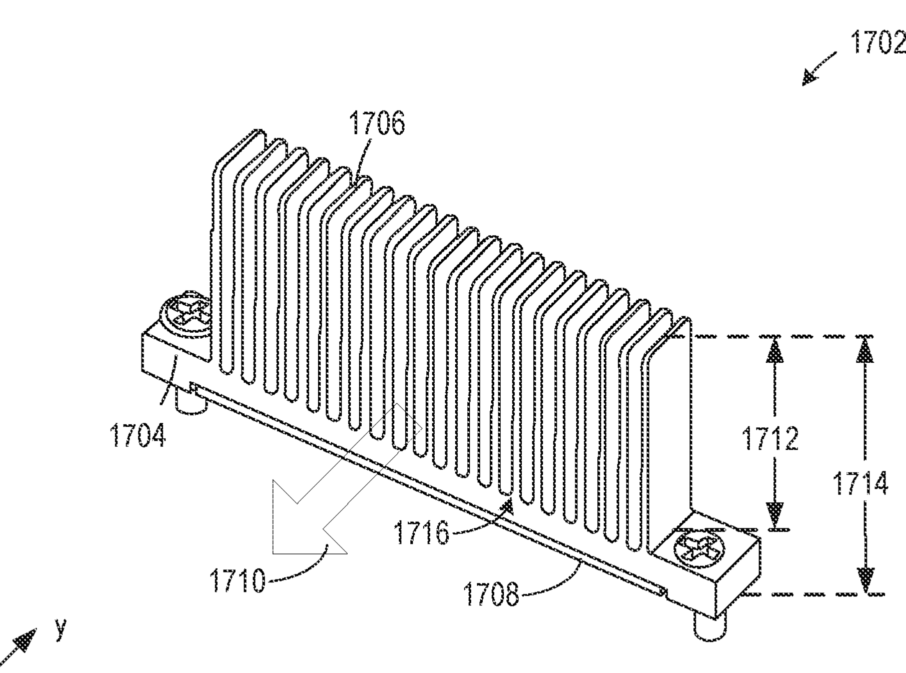
FIGS. 17A and 17B illustrate example rigid finned heatsinks.

FIG. 17A illustrates an example conventional heatsink(s) 1702. The conventional heatsink 1702 includes an example base 1704 and a plurality of example rigid fins 1706 extending from the base 1704 (e.g., in the z-direction). The conventional heatsink 1702 of FIG. 17A is thermally coupled to an example processor 1708, forming an example processor heatsink assembly. However, the processor 1708 may be another type of heat generating component in additional or alternative examples, such as a graphics card, memory component, etc. The conventional heatsink 1702 may facilitate an efficient heat transfer path from the processor 1708 to an ambient environment. For example, heat generated by the processor 1708 during operation can be transferred from an integrated heat spreader (e.g., metal lid) of the processor 1708 to the base 1704 of the heatsink 1702. Heat that is received by the base 1704 may be transferred to the rigid fins 1706 and then to the ambient by way of convection.

The rigid fins 1706 are designed to be in an example flow direction (e.g., airflow direction) 1710, which is a direction in which a coolant (e.g., air, water, etc.) flows. In some examples, a fan may be positioned adjacent the processor heatsink assembly to blow air through the rigid fins 1706 and improve the thermal transfer efficiency from the rigid fins 1706 to the ambient. While examples disclosed herein are discussed in terms of air flow, the flow direction can be defined by another coolant such as for example water or oil. For example, a pump may be positioned adjacent the processor heatsink assembly to provide a flow of a liquid (e.g., water) in the airflow direction 1710.

The base 1704 and rigid fins 1706 may be composed of a thermally conductive material such as copper, aluminum, a metal alloy, etc. The base 1704 and the rigid fins 1706 may be formed of the same material or different materials. The base 1704 and the rigid fins 1706 may be formed using an additive manufacturing process and/or a subtractive manufacturing process. While the rigid fins 1706 of FIG. 17A are straight plate-type rigid fins, the rigid fins 1706 can be other types of rigid fins in additional or alternative examples, such as for example folded plate fins, flared plate fins, pin fins, etc. For example, pin-fin type rigid fins may be used to allow a fluid flow to pass over the rigid fins 1706 in the x-direction and/or the y-direction.

The rigid fin(s) 1706 is associated with an example fin height 1712. The fin height(s) 1712 is defined by a distance measured from an example fin-base interface 1716 to the furthest point of the rigid fin(s) 1706 in the z-direction. The fin-base interface 1716 is a surface the base 1704 and/or the rigid fin(s) 1706 at which the rigid fin(s) 1706 is adjoined with the base 1704. The conventional heatsink 1702 is associated with an example heatsink height 1714, which is defined by a distance measured from a heat transfer surface of the base 1704 to the furthest point of the rigid fin(s) 1706 in the z-direction.

Figure 17B:
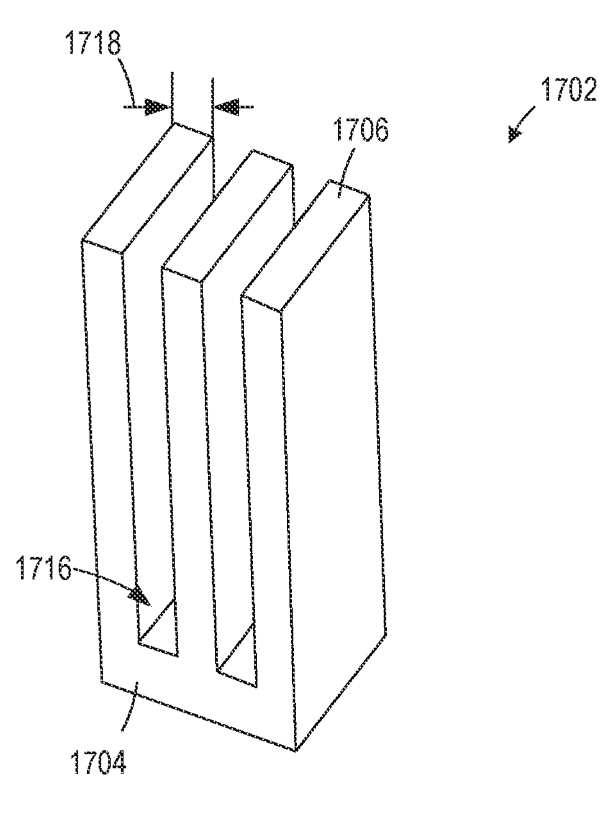

FIG. 17B illustrates another example conventional heatsink 1702. The example conventional heatsink 1702, which is similar to the conventional heatsink 1702 of FIG. 17A, includes an example base 1704 and a plurality of example rigid fins 1706 extending from the base 1704. Each rigid fin(s) 1706 is associated with an example fin thickness 1718, which is a thickness of the rigid fin(s) 1706 (e.g., relative to the x-axis). The fin thickness 1718 and design of the rigid fins 1706 result in the conventional rigid fins 1706 being firm and inflexible.

As hardware component package sizes decrease and amount power dissipation increases, increasingly smaller heatsinks are used to remove increasing amounts heat. The rigid fins 1706 of FIGS. 17A and 17B may not suffice because of the mechanical challenge in manufacturing the heatsink(s) 1702 and/or the higher cost necessitated by advanced engineering techniques. Where conventional rigid heatsink cannot be implemented or do not provide enough cooling with challenges (such as needing a wider base plate size, increased surface area of fins or mounting mechanism, etc.), examples disclosed herein provide for a flexible heatsink that can employed to achieve desired cooling of a hardware component.

Various example flexible finned heatsinks (e.g., flexible heatsinks, flexi-finned heatsinks, etc.) in accordance with teachings of this disclosure are disclosed in detail below. The same reference numbers used for the structures shown in FIGS. 17A-17B are used for similar or identical structures in FIGS. 18-34. Examples disclosed below may be positioned above and/or otherwise adjacent to a heat generating component, such as the processor 1708 of FIG. 17A. It is understood, however, that examples disclosed herein may be implemented in manners. For example, the flexible heatsinks may be positioned above additional or alternative components. In addition, example heatsinks disclosed below may be used to implement one or more of the heatsinks 950, 1150, 1370 discussed above.

Figure 18:
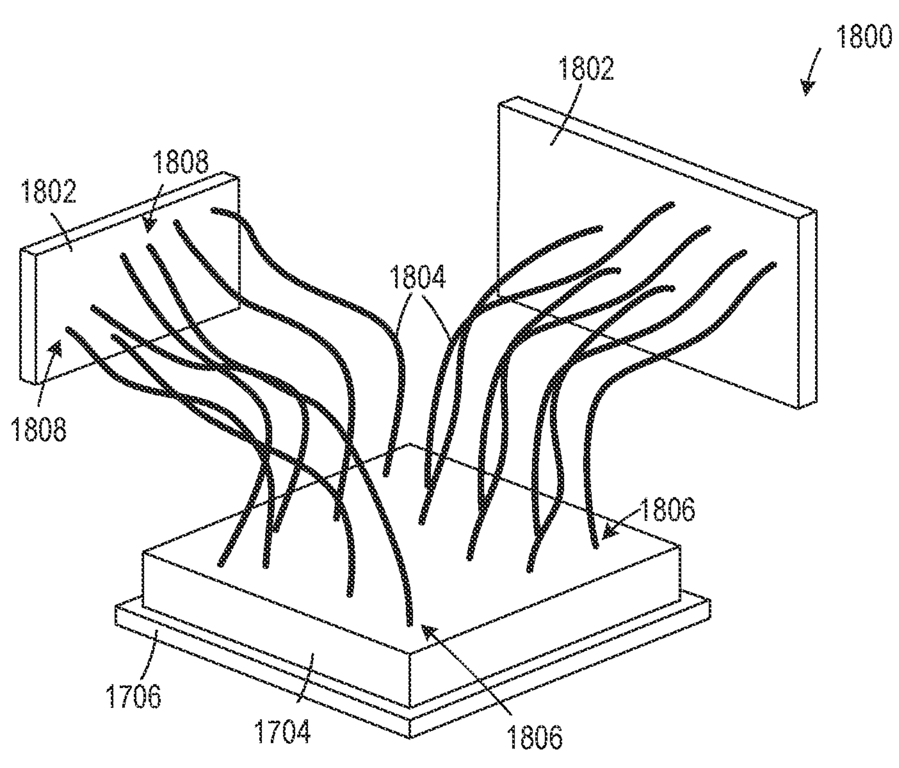
FIG. 18 illustrates an example flexible heatsink constructed in accordance with teachings of this disclosure.

FIG. 18 illustrates an example flexible heatsink 1800 constructed in accordance with teachings of this disclosure. The flexible heatsink 1800 of FIG. 18 includes an example base (e.g., base 1704 of FIGS. 17A-17B), an example termination plate(s) 1802 (e.g., attachment plate, thermally conductive plate, etc.), and example flexible fin(s) 1804. In some examples, the flexible fin(s) 1804 implement means for dissipating heat. The flexible heatsink 1800 of FIG. 18 is thermally coupled to an example processor (e.g., processor 1708 of FIG. 17A) via the base 1704. For example, the base 1704 may be thermally coupled to the processor 1708 via a thermal interface material. In some examples, the base 1704 can be attached to an area of a PCB via a shrouded connector. For example, the area of the PCB area can surrounded by the shrouded connector having a solder mask open with vias to internal planes, such as that of ground. That is, the base 1704 could have the flexible fin(s) 1804 crimped and/or soldered to the base 1704, which could be inserted in a shrouded connector on the same PCB to extract heat from a local heat generating component. In some examples, the base 1704 is a thermally conductive plate. In some examples, the base 1704 implements means for coupling first ends of the flexible fin(s) 1804 to a heat generating component.

The termination plate(s) 1802 is formed of a thermally conductive material, such as for example steel, aluminum, copper, etc. In some examples, the termination plate(s) 1802 is coupled to a surface of a chassis (e.g., housing) surrounding the flexible heatsink 1800, such as a chassis side wall, top cover, bottom cover, rear panel, and/or front panel. In some examples, the termination plate(s) 1802 could be utilized in a chassis-less system. In some such examples, the termination plate(s) 1802 may be attached to any area(s) that provides for cooling of a thermally warm or hot component and which can be reached by the flexible fin(s) 1804.

In some examples, the termination plate(s) 1802 implements means for coupling second ends of the flexible fin(s) 1804 to an area that is cooler than a thermally hot component. In some examples, the base(s) 1704 and/or the termination plate(s) 1802 are couplable to a chassis and/or a hardware component from which the flexible heatsink 1800 is to extract heat. In some such examples, the base(s) 1704 and/or the termination plate(s) 1802 include attachment mechanism(s), such as for example attachment (e.g., mounting holes).

The flexible fins 1804 (e.g., malleable fins) of the example of FIG. 18 are formed of a malleable (e.g., ductile, bendable, etc.), thermally conductive material, such as for example copper, aluminum, an alloy, etc. While the flexible fins 1804 of FIG. 18 are solid, round wires, the flexible fins 1804 can include other designs in additional or alternative examples. For example, the flexible fins 1804 can include different cross-sections (e.g., rectangular, etc.), can be formed of helical springs, can be hollow (e.g., hollow tubes, thermally conductive hollow tubes, etc.), etc. In some examples, the hollow tubes can include internal and/or external grooves. In some examples, grooved tube structures (e.g., of copper) enhance heat transfer (relative to solid wires) to improve cooling by increasing a surface area within the tube(s) (e.g., via the grooves). In some examples, the hollow tubes can include a thermally conductive material(s) (e.g., substance(s)), such as (but not limited to) a liquid, epoxy, and/or another metallic or non-metallic thermally conductive substance to enhance the thermal conduction of the flexible heatsink.

In some examples, the flexible fins 1804 include a rectangular cross-section. In some such examples, the rectangular flexible fins 1804 may be formed by coupling two or more cylindrical wires side-by-side to generate a rectangular strip-like structure. The cylindrical wires may be coupled via soldering, glue, epoxy, etc. In some examples, the rectangular flexible fins 1804 may increase a surface area of the flexible fin(s) 1804 and, as a result, the heat transfer path (e.g., relative to cylindrical wire structures). In some such examples, the flexibility provided by the cylindrical wire(s) is retained while the mechanical strength of assembly improves by attaching the wires side-by-side with a bonding agent (e.g., solder, glue, epoxy, etc.).

The flexible fins 1804 can be electrically conductive, electrically non-conductive, or a combination thereof. In some examples, the flexible fins 1804 are electrically insulated coated (e.g., enameled) wires. For example, because the flexible fins 1804 may be composed of metal, the flexible fins 1804 may be electrically conductive. To prevent electrical shorts caused by a flexible fin 1804 contacting another electrically charged component (e.g., during bending of the flexible fin(s) 1804), the flexible fins 1804 may be coated with an electrically insulating (e.g., dielectric) material. For example, the flexible fins 1804 may be coated with electrically insulating material such as anodization, paint, and/or a similar coating and/or other suitable coatings. To minimize or otherwise reduce a thermal impact caused by the coating, the coating may be thermally conductive and/or thin (having low thermal resistance) so that heat is easily transferred from the flexible fins 1804, through the coating, to the ambient.

In some examples, the coating may be associated with a thickness in a range of ten microns to hundreds of microns. In some examples, a thickness of 10 microns or more may be thick enough such that an electrically conductive flexible fin can withstand electrical potential differences arising out of touches with electrical component without dielectric breakdown of the coating. In some examples, a thickness of hundreds of microns or less is thin enough to establish a thermal resistance for the coating that does not substantially impede the flow of heat from the flexible fin(s) 1804 to the ambient through the coating.

Each of the flexible fin(s) 1804 includes an example first (e.g., base, base interface, etc.) fin end 1806 and an example second (e.g., attachment) fin end 1808. In some examples, the fin ends 1806, 1808 may be coupled to a thermally conductive plate. For example, the first fin end(s) 1806 of FIG. 18 may be coupled to the base-interface surface 1716 of the base 1704 and the second fin end(s) 1808 of FIG. 18 may be coupled to the termination plate(s) 1802. In additional or alternative examples, the first fin ends 1806 and/or the second fin ends 1808 may be coupled to the termination plate(s) 1802 and a region(s) between the first and second fin ends 1806, 1808 may be coupled to the base 1704. In additional or alternative examples, the region(s) between the first and second fin ends 1806, 1808 may be coupled to the termination plate 1802 and the first fin ends 1806 and/or the second fin ends 1808 may be coupled to the base 1704.

While the flexible heatsink 1800 of FIG. 18 includes one base 1704 and two termination plate(s) 1802, the flexible heatsink 1800 can include more or less thermally conductive plates in additional or alternative examples. In some examples, the first fin ends 1806 and/or the second fin ends 1808 may not be coupled to the termination plate(s) 1802. For example, the first fin ends 1806 and/or the second fin ends 1808 may emanate from the base 1704 and, for example, free-hang, be formed into a shape that can restrain itself, be attached to another thermally conductive mass, etc. In some examples, a first portion(s) of the flexible fin(s) 1804 may be coupled to the base 1704 and to one or more termination plate(s) 1802 while a second portion(s) of the flexible fin(s) 1804 may be coupled to the base 1704 without being coupled to the termination plate(s) 1802. It is understood, however, that the flexible heatsink(s) 1800 can be configured in any suitable manner such that the flexible fin(s) 1804 can dissipate heat from an adjacent component.

The flexible fins 1804 can be coupled to the thermally conductive plate(s) 1704, 1802 using any method that allows thermal transfer from the base 1704 to the flexible fins 1804, such as for example crimping, viz soldering, applying a glue, an adhesive, an epoxy, etc. In some examples, utilizing a solder may reduce or otherwise eliminate interstitial resistance from the base 1704 to the flexible fins 1804. In some examples, applying a thermally conductive glue or epoxy minimizes the interface thermal resistance.

Figure 19:
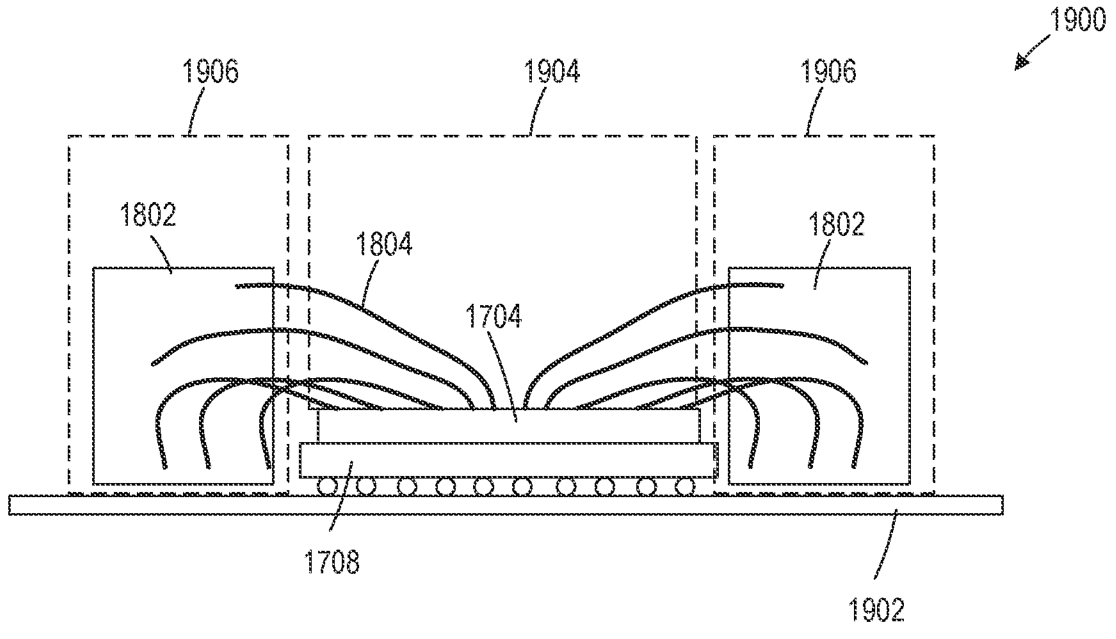
FIG. 19 illustrates another example flexible heatsink constructed in accordance with teachings of this disclosure.

FIG. 19 illustrates another example flexible heatsink 1900 constructed in accordance with teachings of this disclosure. The flexible heatsink 1900 of FIG. 19 includes an example base 1704, example flexible fins 1804, and an example termination plate(s) 1802. The flexible heatsink 1900 is thermally coupled to an example processor 1708, which is mounted on an example PCB 1902. While not illustrated in FIG. 19, the processor heatsink assembly may be positioned within an example chassis. Due to a position of one or more fans (within and/or external from the system), cool air flow within the chassis flows in a particular space and/or direction around the processor 1708, but not necessarily directly above the processor 1708. As such, FIG. 19 illustrates an example inactive (e.g., airflow-less) region 1904 and an example cool air flow region(s) 1906 on each side of the inactive region 1904. For example, the inactive region 1904 may be a region in a shadow of a surrounding, higher height component(s) or connector that is blocking airflow.

A conventional heatsink 1702 with rigid fins 1706 may be unable to position the rigid fins 1706 within the cool airflow region(s) 1906. However, the malleability of the example flexible fin(s) 1804 enables the flexible fin(s) 1804 to be bent (e.g., shaped, adjusted, oriented, etc.) to better reach and/or be oriented within cool airflow region(s) 1906. That is, the malleability of the flexible fin(s) 1804 allows the flexible fin(s) 1804 to be shaped to fit within their immediate space. The flexible fin(s) 1804 are associated with dimensions and/or properties (e.g., thickness, mass, etc.) that allows the flexible fin(s) 1804 to be easily bent (e.g., by hand and/or with a hand tool). However, in some examples, the flexible fin(s) 1804 may not be too flexible as to bend themselves. For example, the flexible fin(s) 1804 may be associated with a self-weight less than a weight needed to move the flexible fin(s) 1804. Further, the flexible fin(s) 1804 can be bent and/or oriented into different stages, each of different shape and/or angle.

The flexible fin(s) 1804 can be secured at the ends 1806, 1808 and/or region(s) between the ends 1806, 1808 by attaching the flexible fin(s) 1804 to the base(s) 1704 and to the termination plate(s) 1802. In some examples, the flexible fin(s) 1804 are strategically routed and anchored such that there is no blockage of air flow to downstream components due to the flexible fin(s) 1804 assembly. Also, in some examples, length of the flexible fin(s) 1804 is selected based on anchor points where the flexible fin(s) 1804 are to be secured, how the flexible fin(s) 1804 are to be routed, and how the flexible fin(s) 1804 are to be accessed during service etc. to avoid any overlap and/or sagging of the flexible fin(s) 1804. In some examples, the flexible fin(s) 1804 may be anchored with spacers (e.g., cable spacer(s)) and/or a braid to allow air to pass through the flexible fin(s) 1804. In some examples, a braided sleeve is added over the flexible fin(s) 1804 close to the exit of the flexible fin(s) 1804 from the base 1704 to control the position of the flexible fin(s) 1804.

In some examples, the flexible fin(s) 1804 may be constructed to avoid blocking air flow to downstream components. For example, the flexible fin(s) 1804 may be circular wires having curvature. As such, air flow tends move around the flexible fin(s) 1804. In some examples, the flexible fin(s) 1804 are of small diameter (e.g., less than 1 mm), leaving little space between the flexible fin(s) 1804, allowing airflow to more easily navigate a path through the flexible fin(s) 1804. In some such examples, a pressure drop may be less as compared to rectangular or square rigid fin(s) 1706 wires, resulting in a smaller pressure drop. Thus, the flexible fin(s)

1804 may enable elimination and/or reduction of downstream components preheating (e.g., due to small cross section of the flexible fin(s) 1804 and/or the flexibility to spread the flexible fin(s) 1804 without impacting heat transfer through wire itself.)

Figure 20:
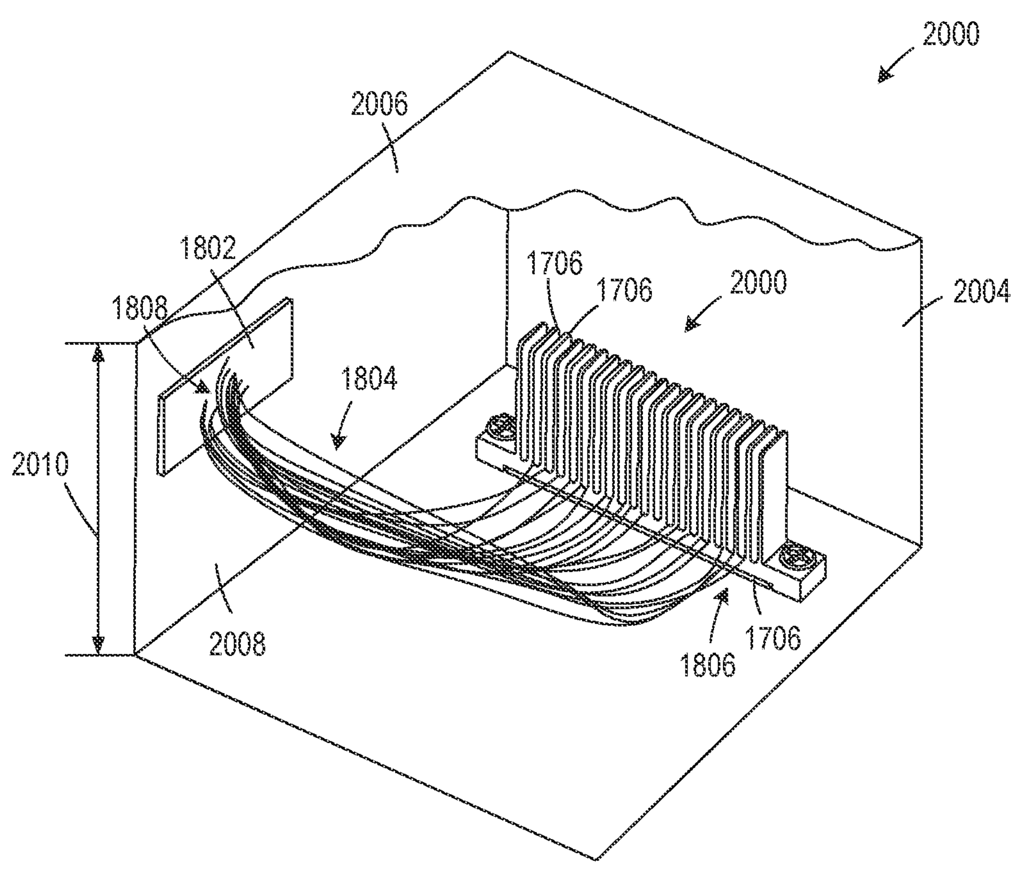
FIG. 20 illustrates another example flexible heatsink constructed in accordance with teachings of this disclosure.

FIG. 20 illustrates another example flexible heatsink 2000 constructed in accordance with teachings of this disclosure, which is positioned within an example chassis (e.g., casing, housing, enclosure, etc.) 2002. For the sake of simplicity, FIG. 20 includes a partial view of the chassis 2002. The flexible heatsink 2000 of FIG. 20 includes an example base 1704, example rigid fins 1706, example flexible fins 1804, and an example termination plate(s) 1802. The rigid fins 1706 extend from the base 1704 of the flexible heatsink 2000. Each of the first ends 1806 of the flexible fins 1804 are coupled to the base 1704, adjacent one or more of the rigid fins 1706. While the rigid fins 1706 of FIG. 20 are plate-type fins, the rigid fins 1706 may be another type(s) of rigid fin(s) in additional or alternative examples, such as for example pin fins.

The chassis 2002 of FIG. 20 may be surrounding an electronic device, such as for example a personal computer (e.g., a laptop, a cell phone, a tablet, a gaming system, etc.) and/or another electronic device, such as for example an Internet of Things (IoT) device. The chassis 2002 includes an example wall(s) (e.g., side wall) 2004, an example cover (e.g., top cover) 2006, and an example panel(s) (e.g., front panel) 2008. It is understood, however, that the chassis 2002 can be designed in any suitable manner. For example, the chassis 2002 can take on a different shape, can exclude the cover 2006 and/or the panel 2008, can include different amounts of the wall(s) 2004, the cover(s) 2006, and/or the panel(s) 2008, etc.

The chassis 2002 is associated with an example height 2010. In some examples, the height 2010 of the chassis 2002 limits an ability to increase an example fin height(s) 1712 of the rigid fin(s) 1706. If additional surface is needed for the flexible heatsink 2000, the flexible fin(s) 1804 are needed to provide the increased surface area. The first end(s) 1806 of the flexible fin(s) 1804 may be coupled to and/or between the rigid fin(s) 1706 and/or to the base 1704. The second end(s) 1808 of the flexible fin(s) 1804 may be coupled to the termination plate(s) 1802, which is coupled to the chassis wall(s) 2004 in FIG. 20 (e.g., via a screw, an adhesive, etc.)

Figure 21:
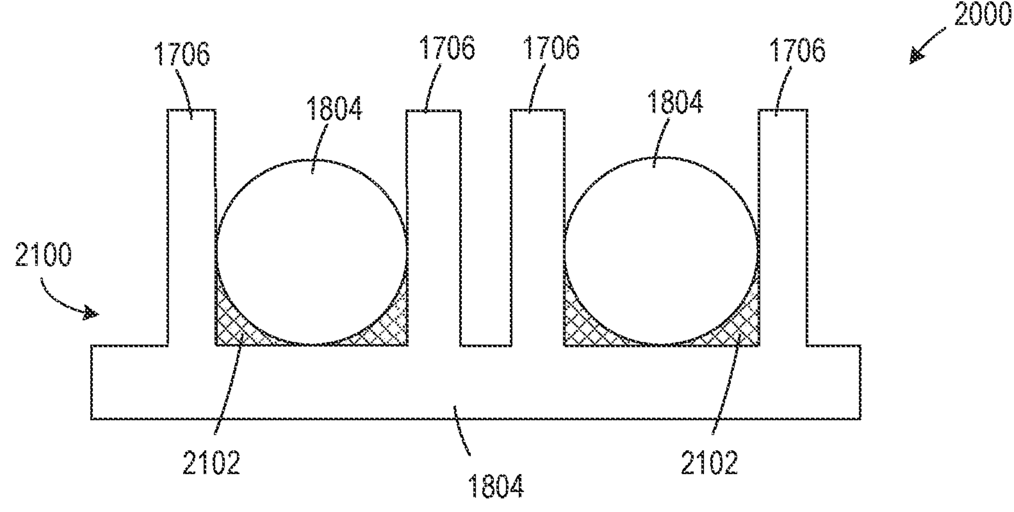
FIG. 21 is partial cross sectional view of the example flexible heatsink of FIG. 20 constructed in accordance with the teachings of this disclosure.

FIG. 21 is a partial cross-sectional view of the example flexible heatsink 2000 of FIG. 20 at an example fin-base interface 1716. As illustrated in FIG. 21, the flexible fins 1804 are coupled to the base 1704, between the rigid fins 1706. In some examples, enamel is stripped from a region of the flexible fin(s) 1804 that will interface with the base 1704 in order to couple the flexible fins 1804 to the base 1704. In some examples, the region is the first end(s) 1806 of the flexible fin(s) 1804. In additional or alternative examples, the region may be a region between the first and second ends(s) 1806, 1808 of the flexible fin(s) 1804 (e.g., a middle region).

In some examples, an example bonding agent 2102 is applied to the stripped region of the flexible fin(s) 1804. The bonding agent can be, for example, a solder material (e.g., Sn48Bi52), a glue (e.g., thermal glue, general purpose glue, etc.), an epoxy (e.g., TC2810 thermal epoxy, etc.), a thermal interface material, and/or another bonding agent capable of adjoining the flexible fin(s) 1804 to the base 1704. An amount of the bonding agent 2102 utilized may depending on the type of bonding agent and a desired mechanical strength and thermal contact. The stripped region(s) of the flexible fin(s) 1804 are placed on (e.g., across) the heatsink base 1704. In some examples, the flexible heatsink 2000 is to be heated (e.g., in an oven) and cured, such as when utilizing a solder bonding agent. For example, the soldered flexible heatsink 2000 may be heated to a solder melting point and cured.

In the illustrated example of FIG. 21, a bonding agent contact area (e.g., an area of the flexible fin(s) 1804 in contact with the bonding agent 2102) is less than an area of the flexible fin(s) 1804 that is adjacent the base 1704 and/or the rigid fin(s) 1706. In other examples, the bonding agent contact area may be increased by depositing enough bonding agent 2102 to substantially fill or exceed a thickness of the flexible fin(s) 1804 to increase a bond strength of the flexible fin(s) 1804 to the base 1704 and/or the rigid fin(s) 1706.

Figure 22:
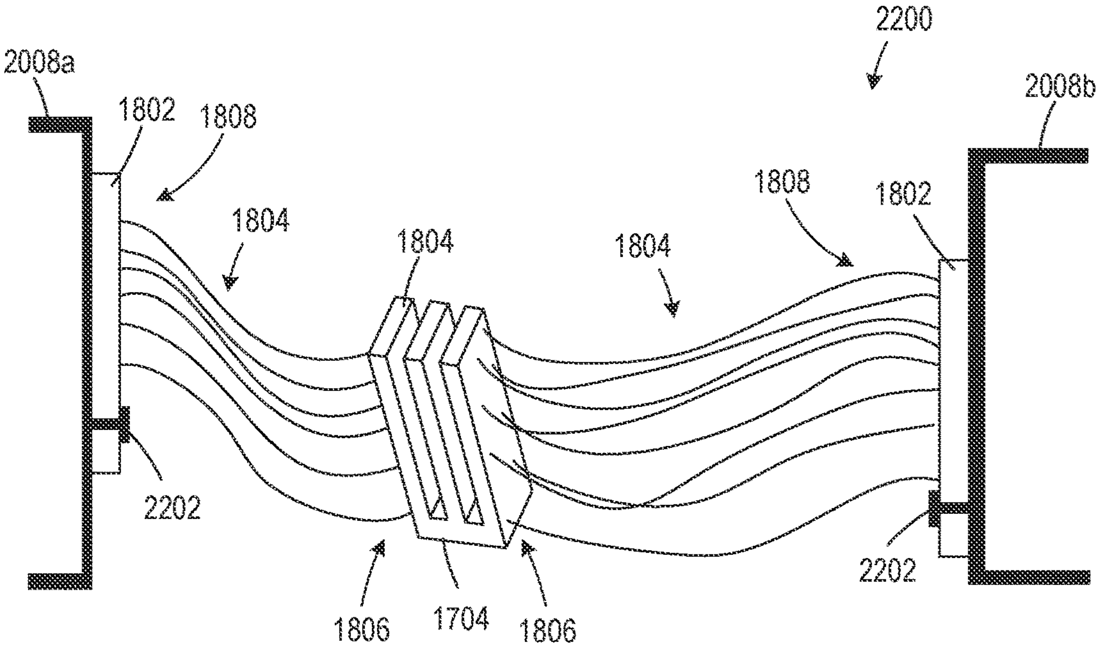
FIG. 22 illustrates another example flexible heatsink constructed in accordance with teachings of this disclosure.

FIG. 22 illustrates another example flexible heatsink 2200 constructed in accordance with teachings of this disclosure. The flexible heatsink 2200 of FIG. 22 includes an example base 1704, example rigid fins 1706, example flexible fins 1804, and an example termination plate(s) 1802. The rigid fins 1706 are plate-type fins that extend from the base 1704 of the flexible heatsink 2200. Each of the first ends 1806 of the flexible fins 1804 are coupled to a rigid fin 1706. While the flexible fins 1804 are coupled to the rigid fins 1706 at the end of the base 1074, the flexible fins 1804 could be coupled to other rigid fins 1706 in additional or alternative examples. While not illustrated in FIG. 22, the flexible heatsink 2200 may be coupled to a hardware component at the base 1704.

In the illustrated examples, the second ends 1808 of the flexible fins 1804 are coupled to the termination plates 1802. A first termination plate 1802 is coupled to an example first chassis wall **2004*a* via an example fastener 2202. A second termination plate 1802 is coupled to an example second chassis wall 2004*b* via another example fastener 2202**. In some examples, the fasteners are screws or rivets.

Figure 23:
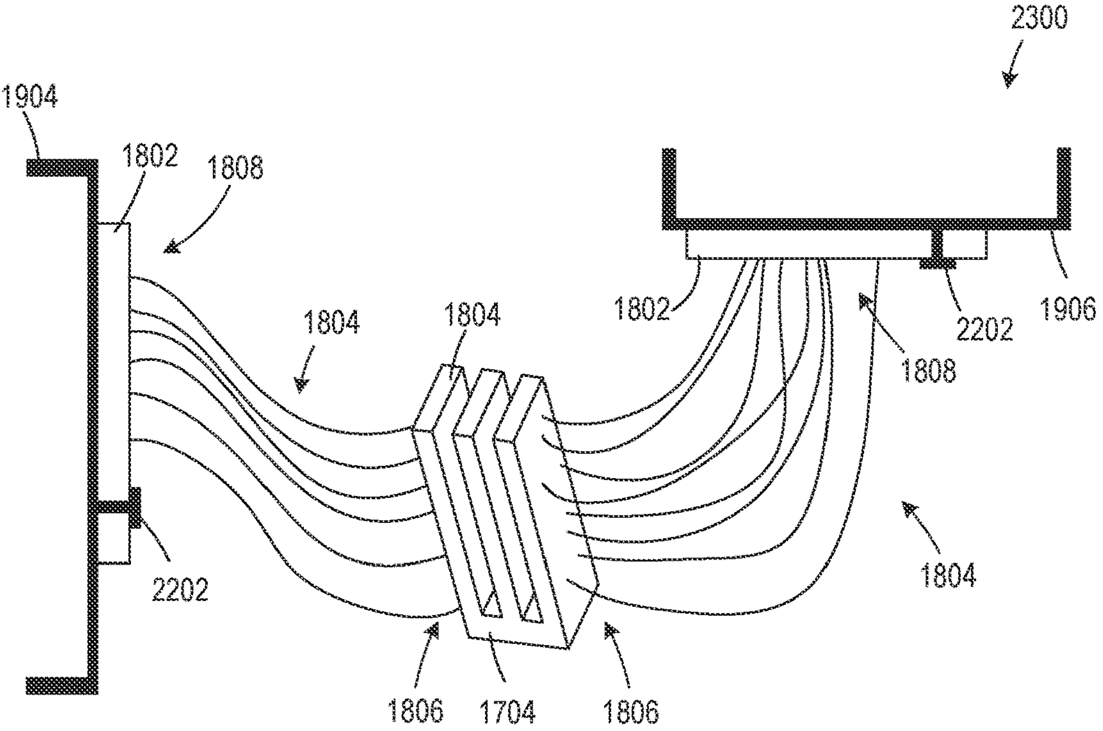
FIG. 23 illustrates another example flexible heatsink constructed in accordance with teachings of this disclosure.

FIG. 23 illustrates another example flexible heatsink 2300 constructed in accordance with teachings of this disclosure. The flexible heatsink 2300 of FIG. 23 is similar to the flexible heatsink 2200 of FIG. 22. Thus, the flexible heatsink 2300 of FIG. 23 includes an example base 1704, example rigid fins 1706, example flexible fins 1804, and example first and second termination plate(s) 1802. The first termination plate 1802 is coupled to the first chassis wall **2004*a* via the example fastener 2202. However, the second termination plate 1802 of FIG. 23 is coupled to an example chassis top cover 2006 via another example fastener 2202**.

In some examples, the flexible fins 1804 being thermally coupled to a chassis surface 2004, 2006, 2208 (e.g., to a corresponding chassis and/or another mass) enables the chassis to act as another heatsink for the processor 1708. That is, heat may transfer from the processor 1708 to the base 1704, from the base to and through the flexible fins 1804, from the flexible fins 1804 to the termination plate(s) 1802, and from the termination plate(s) 1802 to the chassis surface 2004, 2006, 2208.

Figure 24:
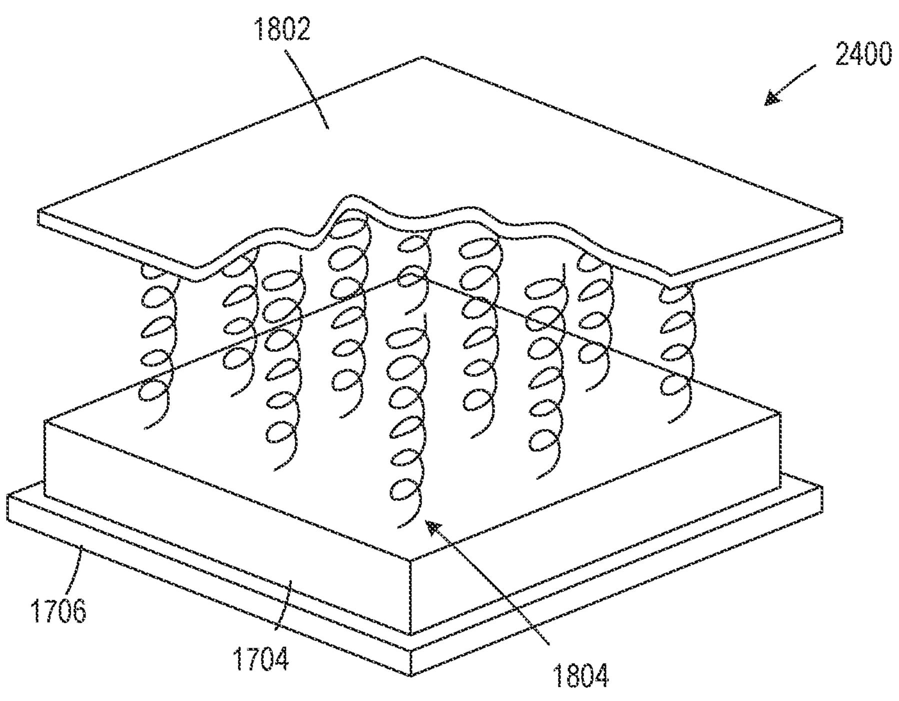
FIG. 24 illustrates another example flexible heatsink constructed in accordance with teachings of this disclosure.

FIG. 24 illustrates another example flexible heatsink 2400 constructed in accordance with teachings of this disclosure. The flexible heatsink 2400 of FIG. 24 includes an example base 1704, an example attachment plate 1802, and a plurality of example flexible fins 1804. The flexible fins 1804 of FIG. 24 are helical spring-type flexible fins. By integrating the helical spring as the flexible fins 1804, a surface area provided by the flexible fins 1804 is increased.

Figure 25:
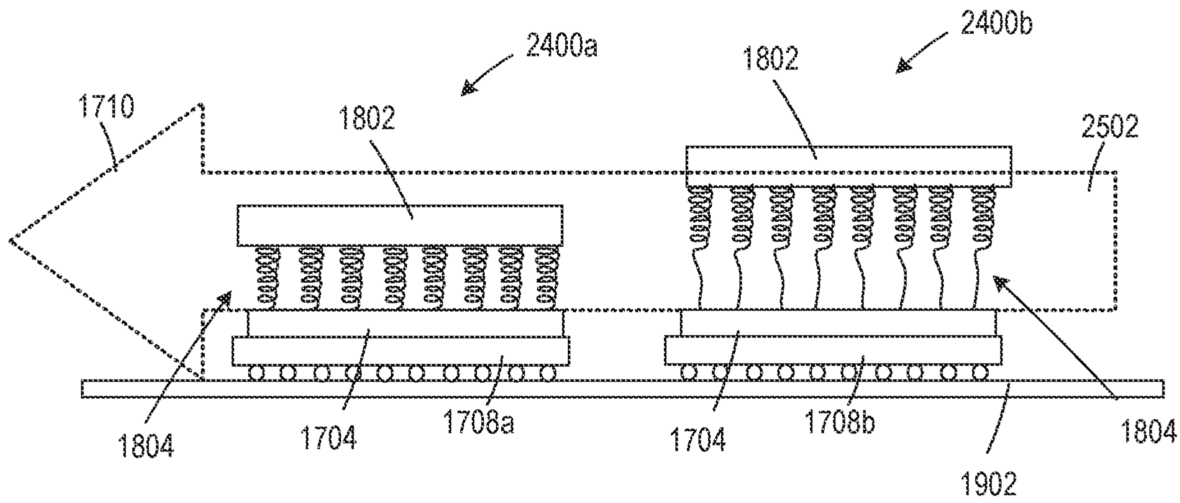
FIG. 25 illustrates another example flexible heatsink constructed in accordance with teachings of this disclosure.

FIG. 25 illustrates an example implementation example flexible heatsink(s) 2400 of FIG. 24 in accordance with teachings of this disclosure for blocking avoidance. A first flexible heatsink **2400*a* is positioned above a first processor 1708*a* and a second flexible heatsink 2400*b* is positioned above a second processor 1708***b*. FIG. 25 illustrates an example airflow 2502 that is in an example airflow direction 1710. The first processor 1708*a* and the first flexible heatsink 2400*a* are downstream relative to the second processor 1708*b* and the second flexible heatsink 2400*b*.

While not illustrated, a similar scenario may be applied to side-by-side conventional heatsinks 1702 with rigid fin(s) 1706. That is, an upstream heatsink 1702 rigid fins 1706 may be placed upstream of a downstream heatsink 1702 with rigid fins 1706. In such a scenario, the upstream rigid fins 1706 may "block" cool airflow relative to the downstream heatsink 1702. As the airflow flows through the rigid fins 1706 of the upstream heatsink 1702, heat is transferred from the rigid fins 1706 to the airflow, thereby warming the airflow. As such, upon the airflow flowing into the downstream rigid fins 1706 of a downstream heatsink 1702, the warmed airflow results in the downstream heatsink 1702 not being cooled to the same extent that the upstream heatsink 1702.

FIG. 25 illustrates an example implementation that enables blocking avoidance. The second flexible heatsink 2400*b* includes flexible fin(s) 1804 that are elevated relative to the flexible fin(s) 1804 of the first flexible heatsink 2400*a*. While the flexible fin(s) 1804 of the first flexible heatsink 2400*a* are in the form of a helical spring from the base 1704 to the termination plate 1802, the flexible fin(s) 1804 of the second flexible heatsink 2400*b* are straight wires to a point at which the termination plate 1802 is reached, and then transition to helical springs. As noted above, circular wires having curvature that allows airflow 2502 to move more easily around the flexible fin(s) 1804. As such, the second flexible heatsink 2400*b* is constructed to avoid blocking airflow 2502 to the downstream first processor 1708*a* and the first flexible heatsink 2400*a*. In the illustrated example of FIG. 25, the first and second flexible heatsinks 2400*a*, 2400*b* include flexible fin(s) 2804 that are oriented so that cool airflow 2502 flows through the respective flexible fins 1804 to cool the respective first and second processors 1708*a*, 1708*b*.

While the flexible fins 1804 of FIG. 25 are helical springs, a similar approach can be used for other types of flexible fins 1804. For example, wire, strip, and/or tube type flexible fins can be bent/shaped to create an opening for the airflow 2502 as it flows upstream to downstream. That is, the flexible fin(s) 1804 can be strategically routed to prevent air blocking and/or air heating with downstream heatsinks and/or components.

Figures 26, 27:
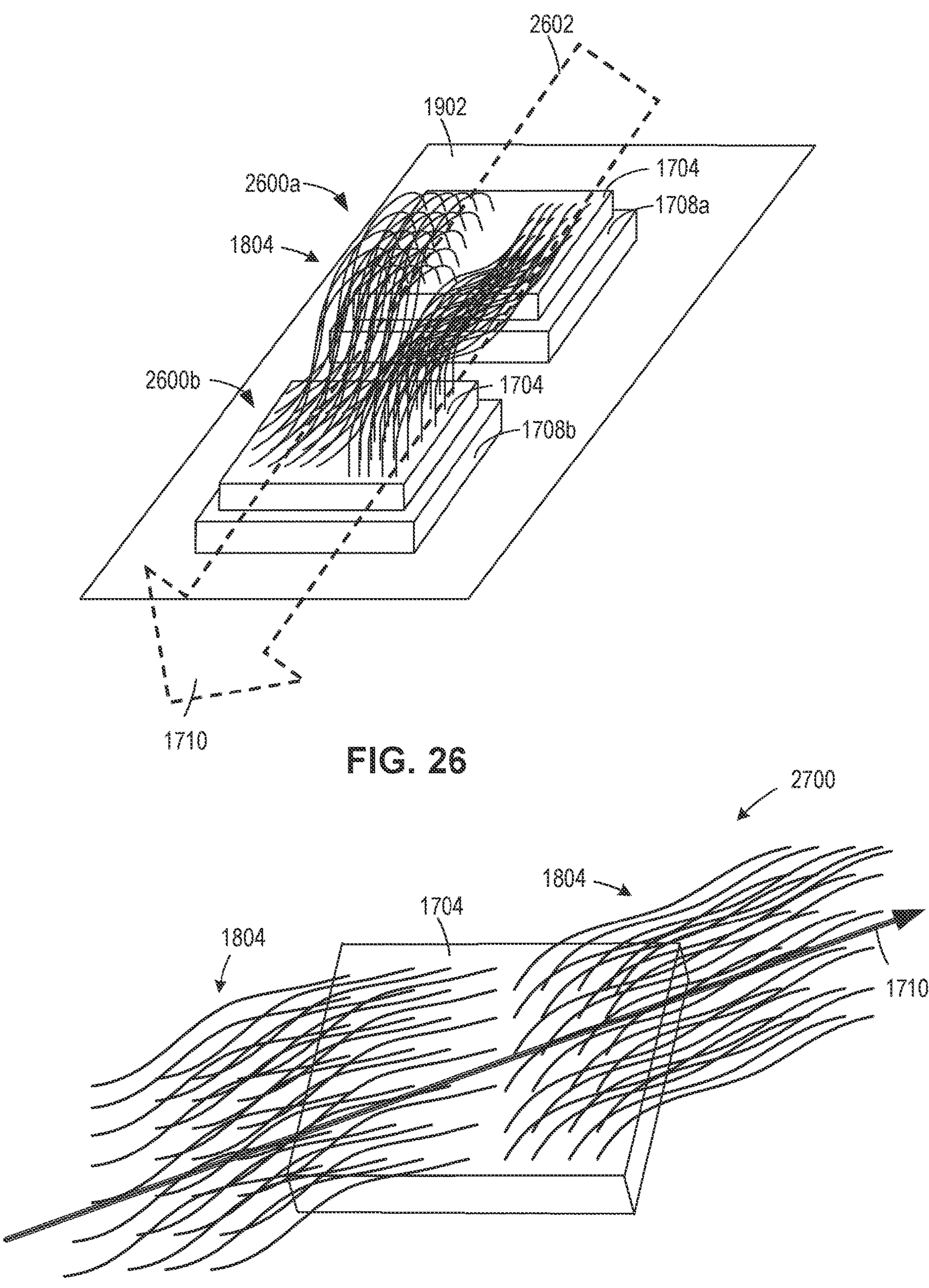
FIG. 26 illustrates another example flexible heatsink constructed in accordance with teachings of this disclosure.
FIG. 27 illustrates another example flexible heatsink constructed in accordance with teachings of this disclosure.

For example, FIG. 26 illustrates an implementation of another example flexible heatsink(s) 2600*a*, 2600*b* constructed in accordance with teachings of this disclosure for block avoidance. FIG. 26 illustrates an example first flexible heatsink 2600*a* positioned above a first processor 1708*a* and an example second flexible heatsink 2600*b* is positioned above a second processor 1708*b*. The first and second processors 1708*a*, 1708*b* are positioned on an example PCB 1902. Each of the flexible heatsinks 2600*a*, 2600*b* of FIG. 26 include an example base 1704 and a plurality of flexible fins 1804.

FIG. 26 illustrates an example airflow 2602 that is in an example airflow direction 1710. The airflows 2602 travels in the airflow direction 1710, which is in a space above the base(s) 1704. The malleability of the flexible fins 1804 allows the flexible fins 1804 to be oriented to increase the flow of air along the flexible fins 1804. A conventional heatsink 1702 with rigid fins 1706 may be unable to position the rigid fins 1706 in such a manner while maintaining a comparable surface area.

The flexible fin(s) 1804 are associated with dimensions and/or properties (e.g., thickness, mass, etc.) that allows the flexible fin(s) 1804 to be easily bent (e.g., by hand and/or with a hand tool). However, in some examples, the flexible fin(s) 1804 may not be too flexible as to bend themselves. For example, the flexible fin(s) 1804 may be associated with a self-weight less than a weight needed to move the flexible fin(s) 1804. Further, the flexible fin(s) 1804 can be bent and/or oriented into different stages, each of different shape and/or angle.

FIG. 27 illustrates a top-down view of another example flexible heatsink(s) 2700 constructed in accordance with teachings of this disclosure. The flexible heatsink 2700 includes an example base 1704 and a plurality of flexible fins 1804. The flexible heatsink 2700 is in an environment in which an example airflow direction 1710 flows across the space directly above the flexible heatsink 2700. The flexible heatsink 2700 of FIG. 27 is structured to increase cooling by orientating the flexible fins 1804 along the airflow direction 1710 such that the length of the fins aligns with the airflow direction 1710. Conventional rigid fins 1706 may not be altered to better receive cool air based on a particular direction of the air flow.

Figure 28A:
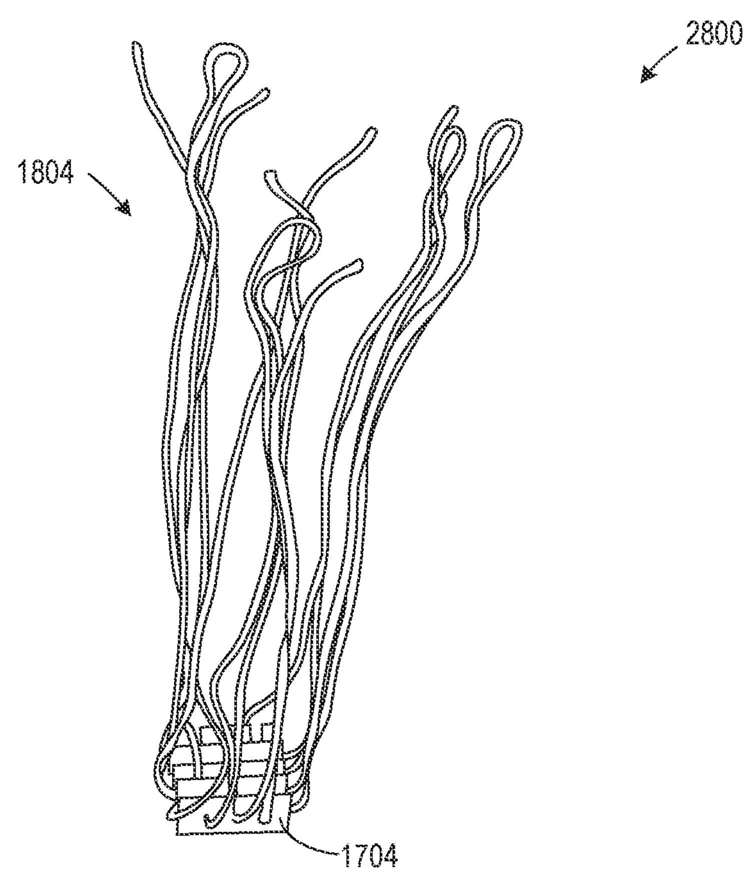
FIG. 28A illustrates another example flexible heatsink constructed in accordance with teachings of this disclosure.

FIG. 28A illustrates another example flexible heatsink 2800 constructed in accordance with teachings of this disclosure. The flexible heatsink 2800 of FIG. 28A includes an example base 1704, example rigid fins 1706, and example flexible fins 1804. In some examples, the flexible fins 1804 are approximately 1 millimeter (mm) in diameter. The base 1704 and the rigid fins 1706 are made of aluminum and integrally formed (e.g., via forging).

Figure 28B:
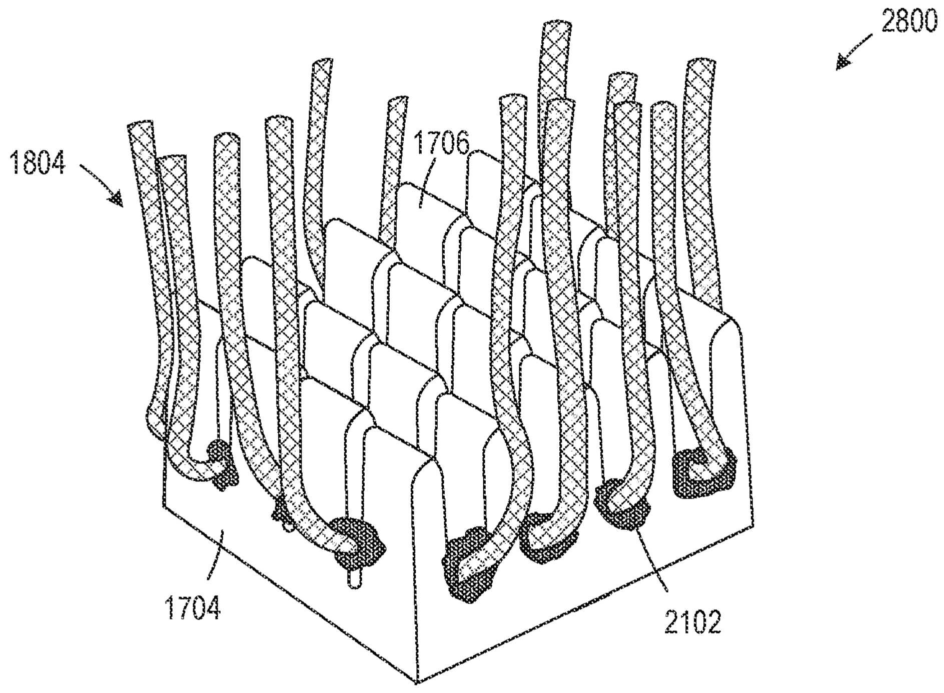
FIG. 28B is an enlarged view of the flexible heatsink of FIG. 28A.

FIG. 28B is a partial, enlarged view of the example flexible heatsink 2800 of FIG. 28A. To manufacture the flexible heatsink 2800, a region (e.g., an intermediate region, a middle region, etc.) of the flexible fin(s) 1804 are placed across the base 1704. For example, enamel may be stripped from the intermediate region, upon which an example bonding agent (e.g., bonding agent 2102) may be applied. By positioning the intermediate region across the base 1704 and between the rigid fin(s) 1706, a contact area of the flexible fin(s) 1804 with the base 1704 is increased, as well as a bond strength of the flexible fin(s) 1804 and, correspondingly, a stiffness of the flexible heatsink 2800. In some examples, the flexible heatsink 2800 is heated (e.g., in an oven) to a melting point of the bonding agent. For example, if the bonding agent 2102 is a solder, the flexible heatsink 2800 may be heated to a solder melting point. In some examples, the flexible heatsink 2800 is cured.

It is noted that if the flexible fin(s) 1804 length is generous, the flexible fin(s) 1804 is secured, and the flexible fin(s) 1804 is appropriately routed, there may not be mechanical stresses acting on the flexible fin(s) 1804 during service, such as tensile force, shear force, bending moment, and/or fatigue. In some such instances, stresses may be applied to the flexible heatsink(s) 2800 during shipping and handling at packaged condition of the flexible heatsink(s) 2800 and/or an electronic device housing the flexible heatsink 2800.

In some examples, a pull test of the flexible fin(s) 1804 can be performed (e.g., using a digital weighing scale) to determine a pull strength of the flexible fin(s) 1804. During testing an of an example flexible heatsink 2800 similar to that of FIG. 28A and/or 28B, the pull strength of the flexible fin(s) 1804 reached up to 30 pounds of pull force. However, other flexible fin(s) 1804 can be associated with higher or lower pull strength. Options to improve pull strength of the flexible fin(s) 1804 include increasing a contact area of a bonding agent, adding braided sleeve to the end(s) 1806, 1806 of the flexible fin(s) 1804, attaching a tie wrap(s) at the end(s) 1806, 1806 of the flexible fin(s) 1804 (e.g., to bundle the flexible fin(s) 1804 to increase their stiff and improve performance to vibration and/or shock), using locking features before soldering/gluing of the flexible fin(s) 1804 and/or adding a locking plate to cover soldered/glued flexible fin(s) 1804, and/or placing the flexible fin(s) 1804 between rigid fin(s) 1706 and/or across the base 1704.

Figure 29:
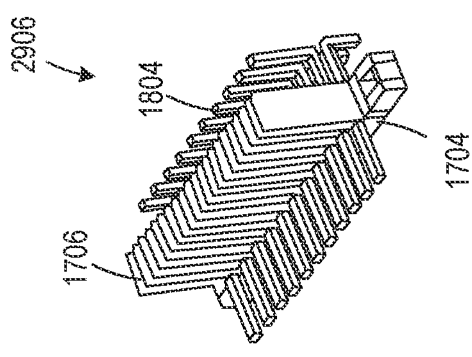
FIG. 29 illustrates example flexible heatsinks with different wire configurations compared to a conventional rigid heatsink.
Figure 29:
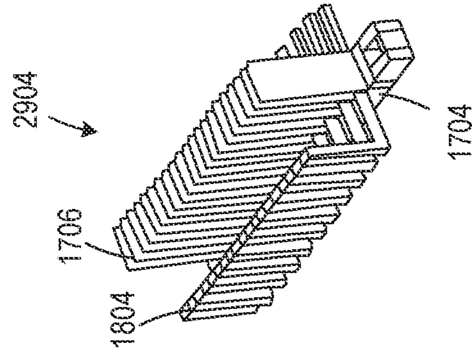
Figure 29:
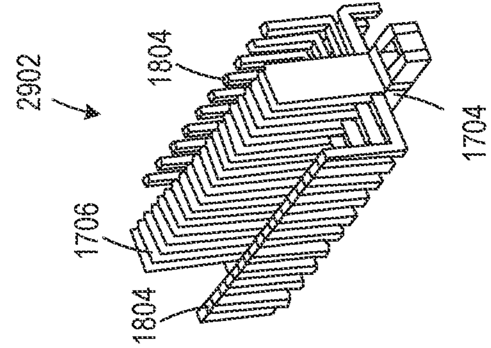
Figure 29:
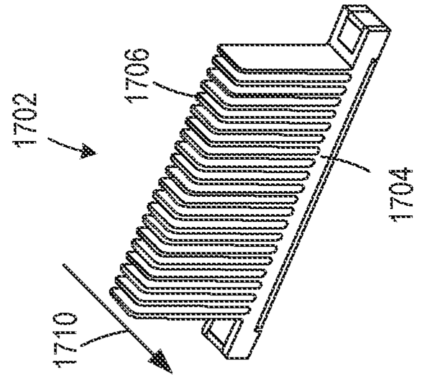

FIG. 29 illustrates results of an example thermal simulation. The thermal simulation compared an example conventional heatsink (e.g., the conventional heatsink 1702 of FIG. 17A) as baseline with three different flexible heatsinks 2902, 2904, 2906, which are modified variants of the conventional heatsink 1702. The flexible heatsinks 2902, 2904, 2906 include wires (e.g., flexible fin(s) 1804), which are attached an example base 1704 between example rigid fins 1706. In some examples, the wires include copper. An example first flexible heatsink 2902 includes the flexible fin(s) 1804 extending on both sides of the rigid fin(s) 1706. In the first flexible heatsink 2902, the flexible fin(s) 1804 extend upward on a first side of the rigid fin(s) 1706 and in two directions, upward and downward on a second side of the rigid fin(s) 1706. An example second flexible heatsink 2904 includes the flexible fin(s) 1804 extending on a first (e.g., left) side of the rigid fin(s) 1706 and in a first (e.g., upward) direction. On a second (e.g., right) side of the rigid fin(s) 1706, the flexible fin(s) 1804 extend a shorter distance. An example third flexible heatsink 2906 includes the flexible fin(s) 1804 extending on an example second (e.g., right) side of the rigid fin(s) 1706 and in both a first (e.g., upward) and a second (e.g., downward) direction. On a second (e.g., left) side of the rigid fin(s) 1706, the flexible fin(s) 1804 extend a shorter distance. In other examples, different combinations of the orientations of the flexible fin(s) 1804 may be constructed.

The different configurations of the heatsinks 1702, 2902, 2904, 2906 exhibit different thermal dissipation properties. For example, in one example simulation, the heatsinks 1702, 2902, 2904, 2906 are enclosed with a wall open in an example direction of airflow 1710 at its exit. A rectangular fan with 10 CFM flow is attached to one wall of the enclosure to flow over the heatsink(s) 1702, 2902, 2904, 2906. A heat source of 28 watts (W) is attached to a heat transfer surface(s) of the heatsinks 1702, 2902, 2904, 2906. The temperature is probed at an example hotspot, which is the bottom of the enclosure (e.g., reflecting a component case top temperature) in this example.

In this example simulation, the baseline heatsink 1702 measured a hotspot temperature at 90.2° C. The first flexible heatsink 2902 measured a hotspot temperature at 72° C. The second flexible heatsink 2904 measured a hotspot temperature at 74.7° C. The third flexible heatsink 2906 measured a hotspot temperature at 77.2° C. Based on at least these results, there is a clear and significant heat transfer improvement with the example flexible fins 1804 added in lateral directions. The hotspot temperature improved by 15% to 20%.

Figure 30:
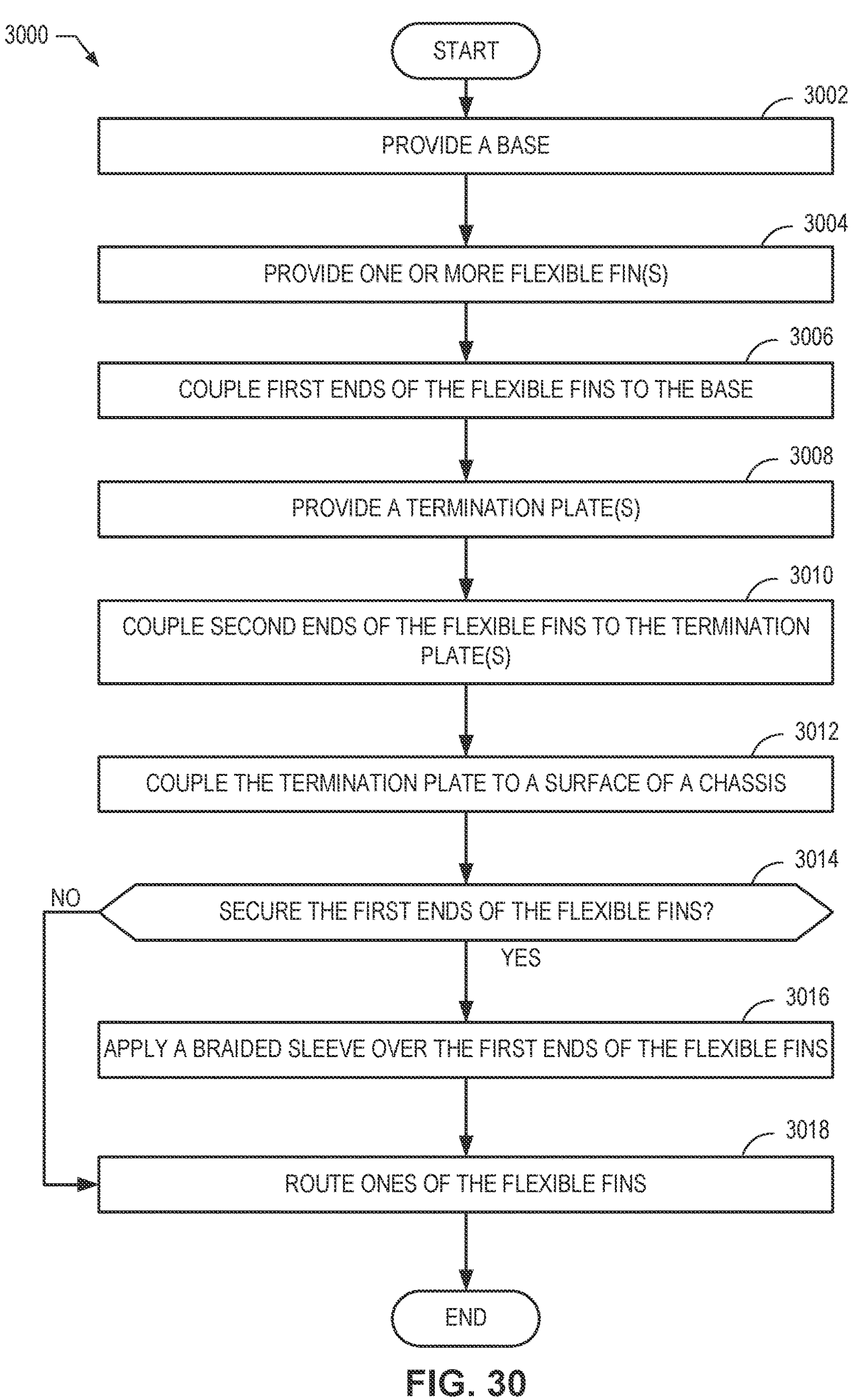
FIGS. 30-32 are flowcharts representative of example methods to manufacture an example flexible heatsink in accordance with teachings of this disclosure.
Figure 31:
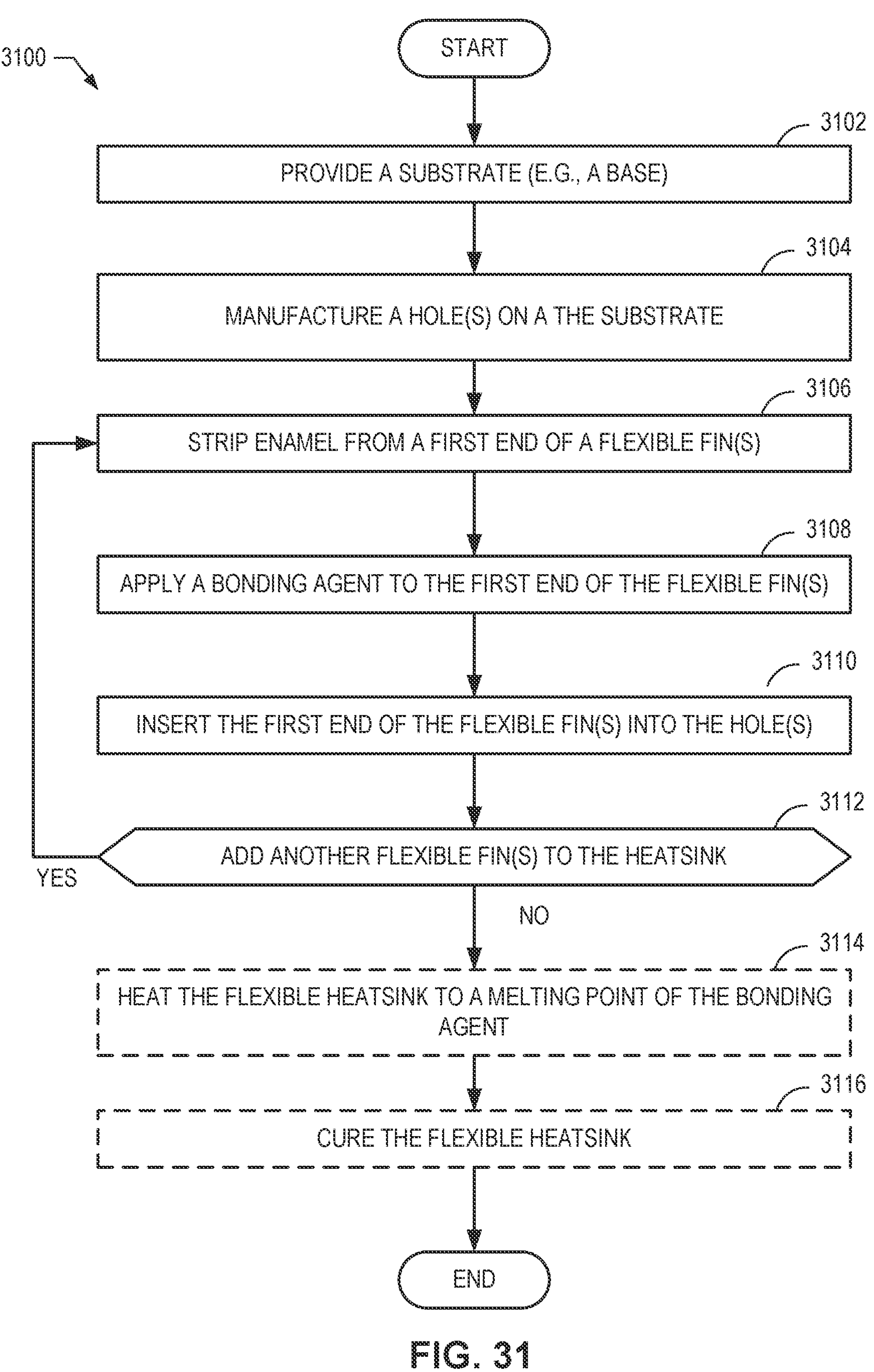
Figure 32:
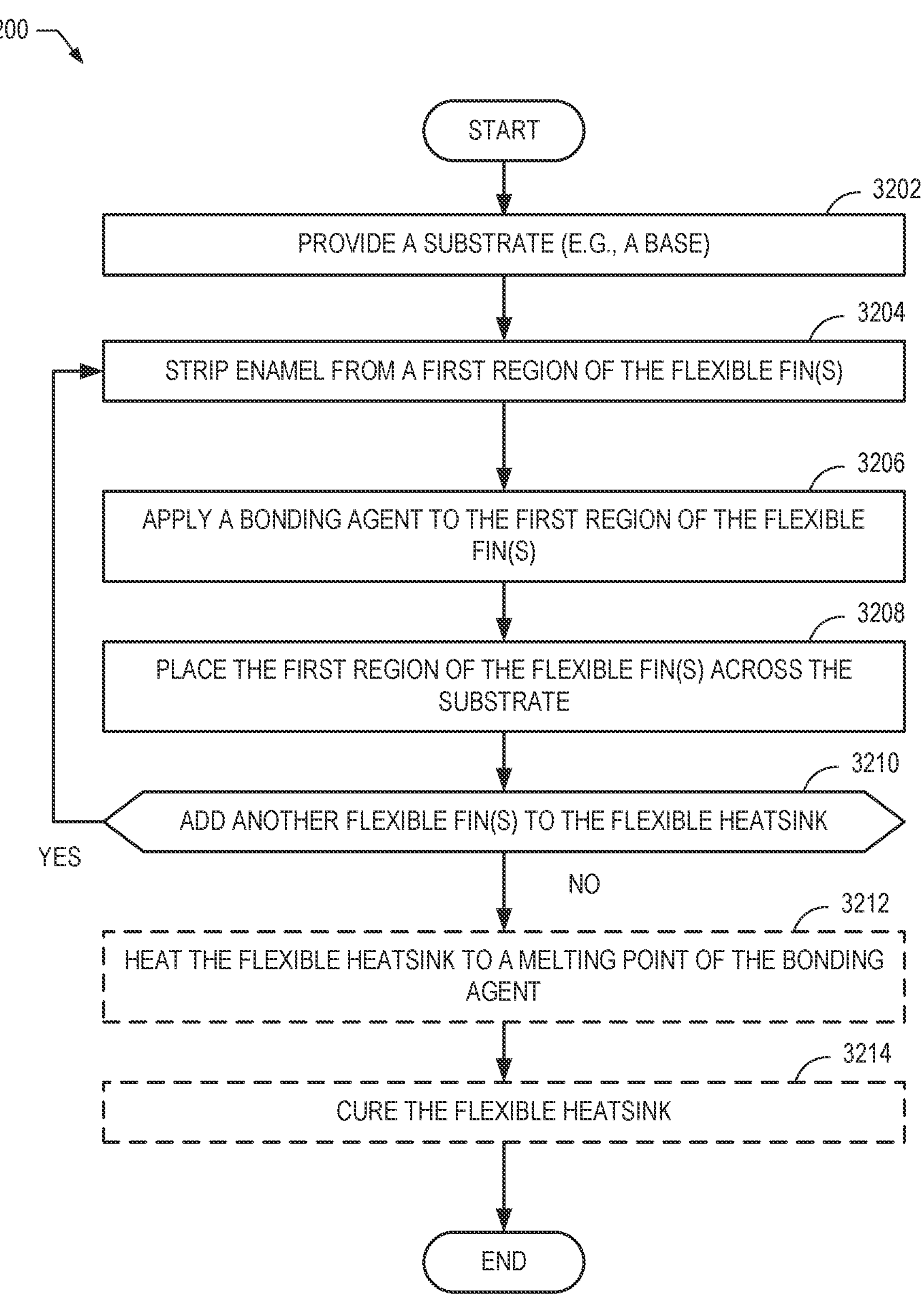

FIGS. 30-32 are flowcharts representative of example methods of creating an example flexible heatsink 1800, 1900, 2000, 2200, 2300, 2400, 2600*a*, 2600*b*, 2700, 2800, 2902, 2904, 2906 in accordance with teachings of this disclosure. Although each example method(s) of manufacture is described with reference to the flowcharts illustrated in FIGS. 30-32, other methods may alternatively be used. For example, the order of execution of the blocks may be changed, and/or some of the blocks described may be combined, divided, re-arranged, omitted, eliminated, and/or implemented in any other way.

FIG. 30 is a flowchart representative of example an example method 3000 of manufacturing an example flexible heatsink 1800, 1900, 2000, 2200, 2300, 2400, 2600*a*, 2600*b*, 2700, 2800, 2902, 2904, 2906 in accordance with teachings of this disclosure. The process begins at block 3002 by providing an example base (e.g., base 1704). For example, the base 1704 may be a metal substrate onto which example flexible fins (e.g., flexible fins 1804) and/or rigid fins (e.g., rigid fins 1706) may be attached.

At block 3004, the process includes providing one or more flexible fin(s) 1804. For example, the flexible fin(s) 1804 may include metal wires (e.g., circular, rectangular, etc.), internally grooved tube(s), helical spring(s), thermally conductive strip(s) (e.g., metal strips), etc. In some examples, the flexible fin(s) 1804 can include more than one type of flexible fin 1804.

At block 3006, the process includes coupling example first ends 1806 of the flexible fins 1804 to the base 1704. For example, the first ends 1806 of the flexible fins 1804 can be coupled to the base using a soldering method, applying an adhesive, crimping, etc.

At block 3008, the process includes providing an example termination plate(s) 1802. For example, the termination plate(s) 1802 may be a thermally conductive plate. At block 3010, the process includes coupling example second end(s) 1808 of the flexible fin(s) 1804 to the example termination plate(s) 1802. At block 3012, the process includes coupling the termination plate(s) 1802 to an example chassis surface 2004, 2006, 2008. By coupling second ends 1808 of the flexible fin(s) 1804 to the termination plate(s) 1802, the termination plate(s) 1802 facilitate attachment of the second ends 1808 to a chassis and/or another area that is to be cooler than a thermally heated component over which the flexible heatsink 1800, 1900, 2000, 2200, 2300, 2400, 2600*a*, 2600*b*, 2700, 2800, 2902, 2904, 2906 may be positioned. The chassis surface may be an example wall(s) 2004, an example cover(s) 2006, and/or an example panel(s) 2008.

At block 3014, the process includes determining whether to secure the end(s) 1806, 1808 of the flexible fin(s) 1804. For example, the flexible fin(s) 1804 can be secured at the ends 1806, 1808 anchoring the ends 1806, 1808 with spacers and/or a braid (e.g., sleeve, braided sleeve, etc.). By adding a braided sleeve over the flexible fin(s) 1804 close to an exit from the base 1704 and/or the termination plate(s) 1802, the position of the flexible fin(s) 1804 can be controlled. If the answer to block 3014 is YES, the process continues to block 3016. At block 3016, the process includes applying a braided sleeve over the end(s) 1806, 1808 of the flexible fin(s) 1804. If the answer to block 3014 is NO, the process continues to block 3018.

At block 3018, the process includes routing ones of the flexible fin(s) 1804. For example, the flexible fin(s) 1804 can be routed to provide to ideal or otherwise adequate cooling of a hardware component, to prevent mechanical stresses from acting on the flexible fin(s) 1804, to avoid blocking of airflow to downstream components and/or heatsinks, etc.

FIG. 31 is a flowchart representative of example an example method 3100 of manufacturing an example flexible heatsink 1800, 1900, 2000, 2200, 2300, 2400, 2600*a*, 2600*b*, 2700, 2800, 2902, 2904, 2906 in accordance with teachings of this disclosure. The process begins at block 3102 by providing an example substrate (e.g., an example base 1704). For example, the substrate 1704 may be a thermally conductive plate.

At block 3104, the process includes manufacturing an example hole(s) into an example fin-base interface 1716 surface of the base 1704. For example, the hole(s) can be manufactured via an additive manufacturing process (e.g., 3-dimensional printing, etc.) and/or via a substrative manufacturing process (e.g., drilling, milling, etc.). In some examples, an amount of the hole(s) is at least equal to amount of flexible fin(s) 1804 to be added to the base 1704.

At block 3106, the process includes stripping enamel from a first end(s) 1806 of a flexible fin(s) (e.g., a wire(s)) 1804. For example, the flexible fin(s) 1804 may be an electrically insulated enameled wire. Thus, the enamel may be stripped from the first end(s) 1806 of the electrically insulated enameled wire(s).

At block 3108, the process includes applying an example bonding agent (e.g., bonding agent 2102) to the first end 1806 of the flexible fin(s) 1804. In some examples, the applying the bonding agent 2102 includes determining an amount of bonding agent needed to achieve desired mechanical strength and/or thermal contact. The bonding agent 2102 may be a solder material, a glue, an epoxy, etc.

At block 3110, the process includes inserting the first end(s) 1806 of the flexible fin(s) 1804 into the hole(s) of the base 1704. In some examples, the inserting the first end(s) 1806 of the flexible fin(s) 1804 into the hole(s) of the base 1704 is completed within a period of time determined by the bonding agent to ensure the first end 1806 of the flexible fin(s) 1804 bonds to the base 1704.

At block 3112, the process includes determining whether to add another wire(s) 1804 to the flexible heatsink 1800, 1900, 2000, 2200, 2300, 2400, 2600*a*, 2600*b*, 2700, 2800, 2902, 2904, 2906. For example, the flexible heatsink 1800, 1900, 2000, 2200, 2300, 2400, 2600*a*, 2600*b*, 2700, 2800, 2902, 2904, 2906 includes less flexible fin(s) 1804 than needed, more flexible fin(s) 1804 may be added. If the answer to block 3114 is YES, the process returns to block 3106. If the answer to block 3114 is NO, the process continues to block 3114.

At block 3114, the process includes heating the flexible heatsink 1800, 1900, 2000, 2200, 2300, 2400, 2600*a*, 2600*b*, 2700, 2800, 2902, 2904, 2906 to an example melting point of the bonding agent. For example, if the bonding agent is a solder material, the flexible heatsink 1800, 1900, 2000, 2200, 2300, 2400, 2600*a*, 2600*b*, 2700, 2800, 2902, 2904, 2906 is to be heated to a melting point of the solder material. In some examples, the flexible heatsink 1800, 1900, 2000, 2200, 2300, 2400, 2600*a*, 2600*b*, 2700, 2800, 2902, 2904, 2906 may not be heated, such as if the bonding agent is a glue.

At block 3116, the process includes curing the flexible heatsink 1800, 1900, 2000, 2200, 2300, 2400, 2600*a*, 2600*b*, 2700, 2800, 2902, 2904, 2906. For example, if the bonding agent is a solder material, the flexible heatsink 1800, 1900, 2000, 2200, 2300, 2400, 2600*a*, 2600*b*, 2700, 2800, 2902, 2904, 2906 may be cured. In some examples, the flexible heatsink 1800, 1900, 2000, 2200, 2300, 2400, 2600*a*, 2600*b*, 2700, 2800, 2902, 2904, 2906 may not be cured, such as if the bonding agent is a glue.

FIG. 32 is a flowchart representative of example an example method 3200 of manufacturing an example flexible heatsink 1800, 1900, 2000, 2200, 2300, 2400, 2600*a*, 2600*b*, 2700, 2800, 2902, 2904, 2906 in accordance with teachings of this disclosure. The process begins at block 3202 by providing an example substrate (e.g., an example base 1704). For example, the substrate 1704 may be a thermally conductive plate. In some examples, the substrate 1704 includes a plurality of example rigid fins 1706.

The process begins at block 3204 by stripping enamel from a first region of a wire(s) 1804. For example, the flexible fin(s) 1804 may be an electrically insulated enameled wire. Thus, the enamel may be stripped from the region of the electrically insulated enameled wire(s). The region may be a region between a first end(s) 1806 of the flexible fin(s) 1804 and a second end(s) 1808 of the flexible fin(s) 1804.

At block 3206, the process includes applying an example bonding agent (e.g., bonding agent 2102) to the first region of the flexible fin(s) 1804. In some examples, the applying the bonding agent 2102 includes determining an amount of bonding agent needed to achieve desired mechanical strength and/or thermal contact. The bonding agent 2102 may be a solder material, a glue, an epoxy, etc.

At block 3208, the process includes placing the first region of the flexible fin(s) 1804 across the substrate 1704. In some examples, the flexible fin(s) 1804 may be positioned between a first rigid fin 1706 and a second rigid fin 1706 of the flexible heatsink 1800, 1900, 2000, 2200, 2300, 2400, 2600*a*, 2600*b*, 2700, 2800, 2902, 2904, 2906.

At block 3208, the process includes determining whether to add another wire(s) 1804 to the flexible heatsink 1800, 1900, 2000, 2200, 2300, 2400, 2600*a*, 2600*b*, 2700, 2800, 2902, 2904, 2906. For example, the flexible heatsink 1800, 1900, 2000, 2200, 2300, 2400, 2600*a*, 2600*b*, 2700, 2800, 2902, 2904, 2906 includes less flexible fin(s) 1804 than needed, more flexible fin(s) 1804 may be added. If the answer to block 3214 is YES, the process returns to block 3204. If the answer to block 3210 is YES, the process continues to block 3212.

At block 3212, the process includes heating the flexible heatsink 1800, 1900, 2000, 2200, 2300, 2400, 2600*a*, 2600*b*, 2700, 2800, 2902, 2904, 2906 to an example melting point of the bonding agent. For example, if the bonding agent is a solder material, the flexible heatsink 1800, 1900, 2000, 2200, 2300, 2400, 2600*a*, 2600*b*, 2700, 2800, 2902, 2904, 2906 may be heated to a melting point of the solder material. In some examples, the flexible heatsink 1800, 1900, 2000, 2200, 2300, 2400, 2600*a*, 2600*b*, 2700, 2800, 2902, 2904, 2906 may not be heated, such as if the bonding agent is a glue.

At block 3214, the process includes curing the flexible heatsink 1800, 1900, 2000, 2200, 2300, 2400, 2600*a*, 2600*b*, 2700, 2800, 2902, 2904, 2906. For example, if the bonding agent is a solder material, the flexible heatsink 1800, 1900, 2000, 2200, 2300, 2400, 2600*a*, 2600*b*, 2700, 2800, 2902, 2904, 2906 may be cured. In some examples, the flexible heatsink 1800, 1900, 2000, 2200, 2300, 2400, 2600*a*, 2600*b*, 2700, 2800, 2902, 2904, 2906 may not be cured, such as if the bonding agent is a glue.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example methods, systems, articles of manufacture, and apparatus have been disclosed that facilitate cooling of a hardware component(s) using a heat dissipating device with flexible fins. Disclosed example flexible heatsinks include a plurality of flexibles fins coupled between an example base (e.g., a thermally conductive plate) and an example termination plate (e.g., another thermally conductive plate). The flexible fins are malleable and can be increased in length to accommodate needed heat dissipation within package and/or mounting constraints.

Example methods and apparatus for cooling hardware disclosed herein. Further examples and combination thereof include the following:

Example 1 includes an apparatus to cool a hardware component comprising a first substrate; a second substrate couplable to a chassis, the second substrate formed of a metal; and a plurality of malleable fins coupled between the first and second substrates, the malleable fins to be formed of a thermally conductive material.

Example 2 includes the apparatus of example 1, wherein ones of the malleable fins are electrically conductive, the ones of the malleable fins to include an electrically insulating coating.

Example 3 includes the apparatus of any one of examples 1-2, wherein the electrically insulating coating is at least one of (a) thermally conductive or (b) less than approximately 900 microns in thickness.

Example 4 includes the apparatus of any one of examples 1-3, wherein the malleable fins include hollow grooved tubes.

Example 5 includes the apparatus of any one of examples 1-4, wherein ones of the hollow grooved tubes include a thermally conductive substance.

Example 6 includes the apparatus of any one of examples 1-5, wherein ones of the malleable fins include a rectangular cross-section.

Example 7 includes the apparatus of example 6, wherein the ones of the malleable fins include a plurality of round wires coupled via a thermally conductive material.

Example 8 includes the apparatus of any one of examples 1-7, wherein ones of the malleable fins are formed into a helical spring.

Example 9 includes the apparatus of any one of examples 1-8, further including a plurality of rigid fins extending from the first substrate, ones of the malleable fins coupled between respective ones of the rigid fins.

Example 10 includes the apparatus of any one of examples 1-8, wherein the malleable fins are coupled to the first substrate via at least one of a solder, an adhesive, or a thermally conductive epoxy.

Example 11 includes the apparatus of example 9, wherein ones of the malleable fins are coupled to the first substrate at a region between ends of respective ones of the malleable fins, the region to extend across a portion of the first substrate.

Example 12 includes the apparatus of any one of examples 1-10, further including a sleeve, the sleeve to surround ones of the malleable fins at a region adjacent the first substrate.

Example 13 includes the apparatus of any one of examples 1-12, further including a sleeve, the sleeve to surround ones of the malleable fins at a region adjacent the first substrate.

Example 14 includes the apparatus of any one of examples 1-13, wherein the first substrate is to couple to a first side of a circuit board.

Example 15 includes the apparatus of example 14, wherein the first side of the circuit board is a secondary side of the circuit board.

Example 16 includes a heatsink comprising a base, a plate, and a plurality of flexible fins, the flexible fins coupled to the base at first regions of the flexible fins and to the plate at second regions of the flexible fins.

Example 17 includes the heatsink of example 16, wherein the plate is a thermally conductive plate formed of a metal.

Example 18 includes the heatsink of any one of examples 16-17, wherein ones of the flexible fins are routed to extend beyond the base.

Example 19 includes the heatsink of one of examples 16-18, further including spacers between ones of the flexible fins, the spacers positioned adjacent the first ends of the flexible fins.

Example 20 includes the heatsink of any one of examples 16-19, wherein ones of the flexible fins include a first end and a second end, the first and second ends to correspond to the second regions, ones of the first regions to be between the first and second ends.

Example 21 includes the heatsink of any one of examples 16-20, wherein ones of the flexible fins include a first end and a second end, the first end to correspond to the first regions, the second end to correspond to the second regions.

Example 22 includes an electronic device comprising a chassis; a heat generating hardware component within the chassis; and a heatsink device to cool the hardware component, the heatsink including: a thermally conductive plate; and flexible fins coupled to the thermally conductive plate.

Example 23 includes the electronic device of example 22, wherein the flexible fins are coupled between the hardware component and the thermally conductive plate.

Example 24 includes the electronic device of any one of examples 22-23, wherein the flexible fins and the thermally conductive plate form a shrouded connector, the shrouded connector coupled to the chassis.

Example 25 includes the electronic device of any one of examples 22-24, wherein the heatsink device includes rigid fins, ones of the flexible fins coupled between respective ones of the rigid fins.

Example 26 includes the electronic device of any one of examples 22-25, wherein the heatsink device includes rigid fins, ones of the flexible fins coupled to a rigid fin.

Example 27 includes the electronic device of any one of examples 22-26, wherein ones of the flexible fins are routed to be able to interrupt a flow of a coolant.

Example 28 includes the electronic device of any one of examples 22-27, wherein ones of the flexible fins are routed such that the wires do not block air flow to hardware components downstream of the heatsink device.

Example 29 includes the electronic device of any one of examples 22-28, wherein the flexible fins are coupled to the thermally conductive plate, and the thermally conductive plate is coupled to the hardware component.

Example 30 includes the electronic device of any one of examples 22-29, wherein the heatsink device includes rigid fins extending from the thermally conductive plate, ones of the flexible fins to be at least one of (a) coupled between respective ones of the rigid fins or (b) coupled to a rigid fin.

Example 31 includes the electronic device of any one of examples 22-30, wherein the heatsink device is a first heatsink device, further including a second heatsink device, the flexible fins of the first heatsink device to extend to an area adjacent the second heatsink device.

Example 32 includes an apparatus comprising means for providing a surface area for heat dissipation, the means for providing the surface area to be malleable; means for coupling first ends of the means for providing the surface area to a hardware component; and means for coupling second ends of the means for providing the surface area to a housing.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus to cool a hardware component, the apparatus comprising:

a first substrate;

a second substrate couplable to a chassis, the second substrate including a metal; and a plurality of malleable fins coupled between the first and second substrates, the malleable fins including a thermally conductive material, wherein the malleable fins are coupled to the first substrate at a region between ends of respective ones of the malleable fins, the region to extend across a portion of the first substrate.

2. The apparatus of claim 1, wherein at least some of the malleable fins are electrically conductive and include an electrically insulating coating.

3. The apparatus of claim 2, wherein the electrically insulating coating is at least one of (a) thermally conductive or (b) less than approximately 900 microns in thickness.

4. The apparatus of claim 1, wherein the malleable fins include hollow grooved tubes.

5. The apparatus of claim 1, wherein at least some of the malleable fins include a rectangular cross-section.

6. The apparatus of claim 5, wherein at least some of the malleable fins include a plurality of round wires coupled via a thermally conductive material.

7. The apparatus of claim 1, wherein at least some of the malleable fins are formed into a helical spring.

8. The apparatus of claim 1, including a plurality of rigid fins extending from the first substrate, at least some of the malleable fins coupled between respective ones of the rigid fins.

9. The apparatus of claim 1, wherein the malleable fins are coupled to the first substrate via at least one of a solder, an adhesive, or a thermally conductive epoxy.

10. The apparatus of claim 1, including a sleeve, the sleeve to surround ones of the malleable fins at a region adjacent to the first substrate.

11. An apparatus to cool hardware, the apparatus comprising:

a first substrate to couple to a first side of a circuit board that is different than a second side of the circuit board, the hardware coupled to the second side of the circuit board;

a second substrate couplable to a chassis, the second substrate including metal; and a plurality of malleable fins coupled between the first and second substrates, the malleable fins including a thermally conductive material.

12. An electronic device comprising:

a chassis;

heat generating hardware within the chassis; and the apparatus of claim 1 to cool the hardware.

13. The electronic device of claim 12, wherein the malleable fins and the first substrate form a shrouded connector, the shrouded connector coupled to the chassis.

14. The electronic device of claim 12, wherein at least one of the first substrate or the second substrate is coupled to the hardware.

15. The electronic device of claim 14, wherein the apparatus includes rigid fins extending from the first substrate, ones of the malleable fins to be at least one of (a) coupled between respective ones of the rigid fins or (b) coupled to a rigid fin.

* * * * *